United States Patent
Kakoee et al.

(10) Patent No.: US 10,625,752 B2
(45) Date of Patent: Apr. 21, 2020

(54) SYSTEM AND METHOD FOR ONLINE FUNCTIONAL TESTING FOR ERROR-CORRECTING CODE FUNCTION

(71) Applicant: QUALCOMM Incorporated, San Diego, CA (US)

(72) Inventors: Mohammad Reza Kakoee, San Diego, CA (US); Rahul Gulati, San Diego, CA (US); Eric Mahurin, Austin, TX (US); Suresh Kumar Venkumahanti, Austin, TX (US); Dexter Chun, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 119 days.

(21) Appl. No.: 15/838,777

(22) Filed: Dec. 12, 2017

(65) Prior Publication Data

US 2019/0176838 A1    Jun. 13, 2019

(51) Int. Cl.
| | |
|---|---|
| *G06F 11/10* | (2006.01) |
| *B60W 50/02* | (2012.01) |
| *H03M 13/05* | (2006.01) |
| *G06F 11/22* | (2006.01) |
| *H04L 1/24* | (2006.01) |

(52) U.S. Cl.
CPC ..... *B60W 50/0205* (2013.01); *G06F 11/1048* (2013.01); *G06F 11/2215* (2013.01); *H03M 13/05* (2013.01); *H04L 1/24* (2013.01)

(58) Field of Classification Search
CPC .............................. G06F 11/10; G06F 11/1048
USPC ............................................................ 714/2
See application file for complete search history.

(56) References Cited

U.S. PATENT DOCUMENTS

| | | | | |
|---|---|---|---|---|
| 4,794,597 A | * | 12/1988 | Ooba | G11C 29/44 365/201 |
| 6,044,483 A | * | 3/2000 | Chen | G06F 11/1044 714/48 |
| 6,701,480 B1 | * | 3/2004 | Karpuszka | G06F 11/1056 714/764 |

(Continued)

FOREIGN PATENT DOCUMENTS

| | | |
|---|---|---|
| EP | 1160987 A2 | 12/2001 |
| WO | 2016161409 A1 | 10/2016 |

OTHER PUBLICATIONS

"Road vehicles—Functional safety—Part 1: Vocabulary," International Standard ISO/IEC 26262-1, Nov. 15, 2011, 30 pages.

(Continued)

*Primary Examiner* — Kamini B Patel
(74) *Attorney, Agent, or Firm* — Qualcomm Incorporated

(57) ABSTRACT

A system and a method for error-correction code ("ECC") error handling is described herein. In one aspect, the system and method may operate an ECC function on raw data. The ECC function may include generating ECC syndrome data by an ECC syndrome data generating module. The ECC syndrome data may be derived from the raw data. The system and a method may further inject a fault based on the ECC syndrome data or the raw data. The system and a method may further determine whether the ECC error detected by the ECC checker corresponds to a malfunction of the ECC function or the fault injected based on the ECC syndrome data or the raw data.

22 Claims, 9 Drawing Sheets

(56) References Cited

U.S. PATENT DOCUMENTS

| | | | |
|---|---|---|---|
| 8,707,104 B1* | 4/2014 | Jean | G06F 11/1048 714/41 |
| 2003/0069963 A1* | 4/2003 | Jayant | H04L 29/06027 709/224 |
| 2003/0182611 A1* | 9/2003 | Wu | G06F 11/1052 714/752 |
| 2008/0109705 A1* | 5/2008 | Pawlowski | G06F 11/1044 714/767 |
| 2008/0201620 A1* | 8/2008 | Gollub | G06F 11/1044 714/718 |
| 2009/0249148 A1* | 10/2009 | Ito | G06F 11/1008 714/746 |
| 2010/0306776 A1* | 12/2010 | Greene | G06Q 10/10 718/101 |
| 2011/0197106 A1* | 8/2011 | Kishigami | H03M 13/09 714/755 |
| 2011/0239090 A1* | 9/2011 | Iwatsuki | G11C 29/56 714/763 |
| 2012/0266033 A1 | 10/2012 | Gold et al. | |
| 2013/0223208 A1* | 8/2013 | Liao | H04L 41/5054 370/229 |
| 2014/0047252 A1* | 2/2014 | Ansari | G06F 1/26 713/320 |
| 2018/0213444 A1* | 7/2018 | Khawand | H04W 28/24 |
| 2018/0331692 A1* | 11/2018 | Gulati | H03M 13/015 |

OTHER PUBLICATIONS

International Search Report and Written Opinion—PCT/US2018/055654—ISA/EPO—dated Mar. 21, 2019.

* cited by examiner

SYSTEM AND METHOD FOR ONLINE FUNCTIONAL TESTING FOR ERROR-CORRECTING CODE FUNCTION

FIELD

The present disclosure relates generally to systems and methods for online functional testing for error detection or correction function.

BACKGROUND

The automotive industry is changing, in part, because the vehicle's power sources are moving from utilizing fossil fuels to utilizing renewable fuels (e.g., electricity). More vehicles are utilizing advanced driver-assistance systems ("ADAS"), which provides varying levels of driver assistance (e.g., adaptive cruise control ("ACC"), forward collision warning ("FCW"), etc.).

As more and more vehicles are equipped with electric engines and ADAS, the circuits embedded within the vehicle will correspondingly need to be equipped to handle many of the problems that face the circuits in other operating environments (e.g., smartphones, servers, etc.). One such problem is handling, and potentially correcting, errors within data stored in memory. Errors can occur anywhere containing data (e.g., memory, caches, buses, interconnects, etc.). Unlike traditional operating environments, the circuits in vehicles may not be able to go offline to conduct tests to establish the veracity of the data stored in its subsystems. For example, a vehicle may be engaged in a complex ADAS-based use case that does not have sufficient offline time to conduct tests, including, but not limited to, potential restoration of data.

Accordingly, what is needed is a system and method for utilizing error-correcting code ("ECC") operations in circuits embedded within a vehicle while the circuits in operation, even if the operation is within a vehicle that cannot "power down" for a self-test of its data.

SUMMARY

A system and a method for error-correction code ("ECC") error handling is described herein. In one aspect, the system and method may operate an ECC function on raw data. The ECC function may include generating ECC syndrome data by an ECC syndrome data generating module. The ECC syndrome data may be derived from the raw data. The system and method may further inject a fault based on the ECC syndrome data and/or the raw data and detect, by an ECC checker, an ECC error. The system and a method may further determine whether the ECC error detected by the ECC checker corresponds to a malfunction of the ECC function or the fault injected based on the ECC syndrome data or the raw data.

In another aspect, the system and method may include a memory configured to store raw data and ECC syndrome data and at least one processor coupled to the memory. The at least one processor may be configured to operate an ECC function on the raw data. The ECC function may include generating ECC syndrome data. The ECC syndrome data may be derived from the raw data. The at least one processor may be further configured to inject a fault based on the ECC syndrome data and/or the raw data, to detect an ECC error, and to determine whether the ECC error corresponds to a malfunction of the ECC function or the fault injected based on the ECC syndrome data and the raw data.

In another aspect, the system and method may include an error detection or correction path configured to perform an ECC function on raw data (e.g., a collection of circuits that perform error detection or correction). The error detection or correction path may include an ECC syndrome data generating module configured to generate ECC syndrome data from the raw data. The system and method may further include a test checker module configured to inject a fault based on the ECC syndrome data and. the raw data and an ECC checker configured to detect an ECC error. The test checker module may be further configured to determine whether the ECC error detected by the ECC checker corresponds to a malfunction of the ECC function or the fault injected based on the ECC syndrome data and the raw data.

In another aspect, the system and method may include a first error detection or correction path. The first error detection or correction path may be configured to perform an ECC function on raw data. The system and method may include a second error detection or correction path configured to detect an ECC error resulted from a malfunction in the first error detection or correction path while the first error detection or correction path is online.

The system and the method may further transmit the actual interrupt to an external system, where the external system may be configured to handle the actual interrupt. In one aspect, the system and the method may receive the actual interrupt at the external system, where the external system may be configured to control advanced driver-assistance systems ("ADAS") embedded within a vehicle. In addition, the external system may be configured to handle errors affecting the reliability of the ADAS within the vehicle. The system and the method may further receive the raw data from a plurality of data sources and may arbitrate the generated interrupts between the sources. In one aspect, the system and the method may delay the checking of the ECC error until the raw data is not being accessed, where the raw data may be received based on a quality of service system. If the delay is in excess of a fault-tolerant deadline, the system and method may adjust the quality of service system to reduce the delay of the ECC error check.

BRIEF DESCRIPTION OF THE DRAWINGS

In the figures, like reference numerals refer to like parts throughout the various views unless otherwise indicated. For reference numerals with letter character designations such as "102A" or "102B", the letter character designations may or may not differentiate two like parts or elements present in the same figure. Letter character designations for reference numerals may be omitted when it is intended that a reference numeral to encompass all parts having the same reference numeral in all Figures.

DETAILED DESCRIPTION

Figure 1:
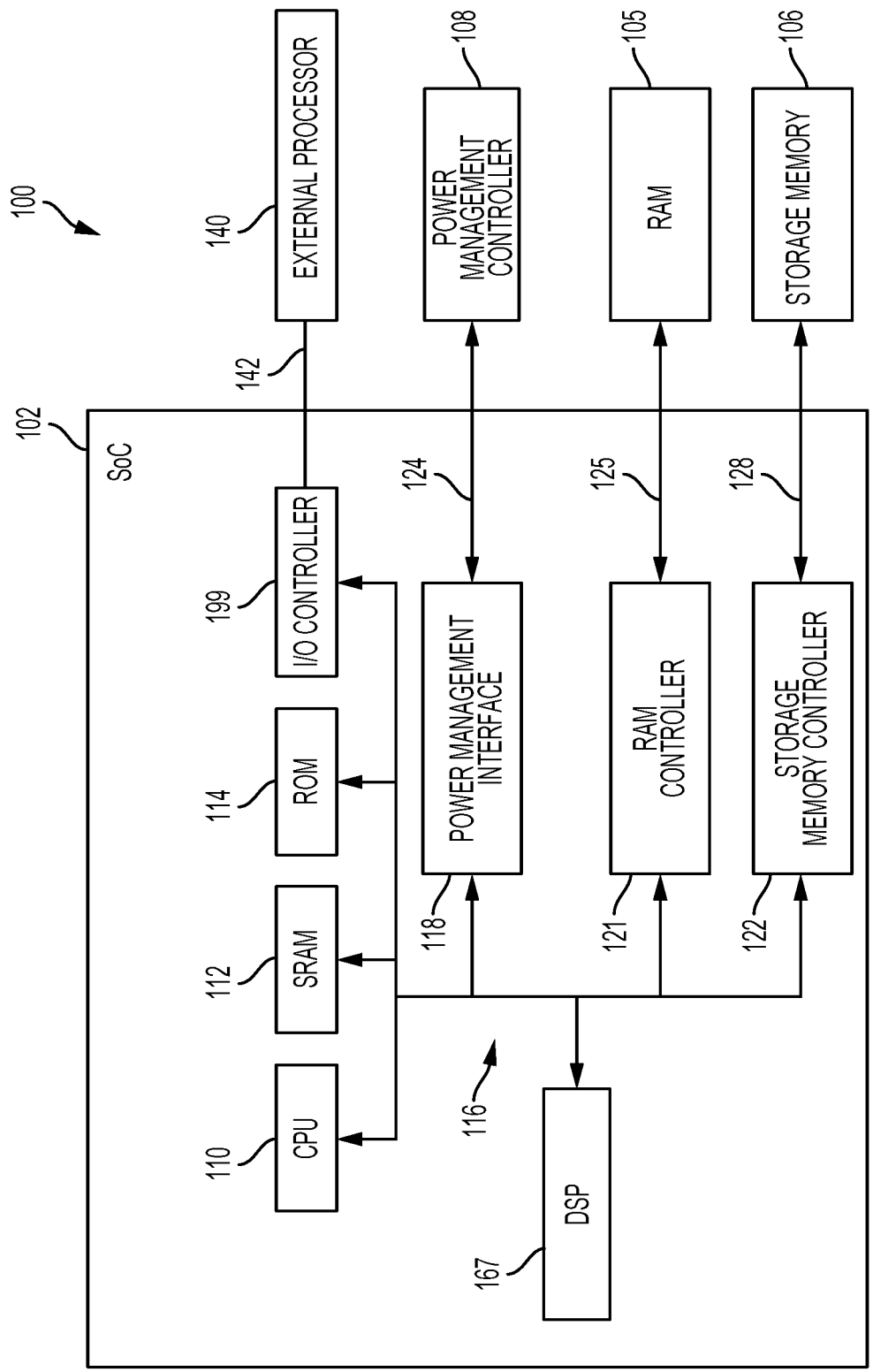
FIG. 1 illustrates a block diagram of a system configured to perform online ECC function and online malfunction detection of the ECC function.

The word "exemplary" is used herein to mean "serving as an example, instance, or illustration." Any aspect described herein as "exemplary" is not necessarily to be construed as preferred or advantageous over other aspects.

In this description, the term "application" may also include files having executable content, such as: object code, scripts, byte code, markup language files, and patches. In addition, an "application" referred to herein, may also include files that are not executable in nature, such as documents that may need to be opened or other data files that need to be accessed.

The term "content" may also include files having executable content, such as: object code, scripts, byte code, markup language files, and patches. In addition, "content" referred to herein, may also include files that are not executable in nature, such as documents that may need to be opened or other data files that need to be accessed.

As used in this description, the terms "component," "database," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

In this description, the terms "communication device," "mobile computing device," "wireless device," "wireless telephone," "wireless communication device," "wireless handset," "automobile," "vehicle," "car," and "ADAS-enabled vehicle" are used interchangeably. With the advent of third generation ("3G"), fourth generation ("4G"), and fifth generation ("5G") wireless technologies, greater bandwidth availability has enabled more mobile computing devices with a greater variety of wireless capabilities. Therefore, a mobile computing device may include a cellular telephone, a pager, a PDA, a smartphone, a navigation device, an Internet of Things ("IoT") device, a wearable device, a hand-held computer with a wireless connection, or a vehicle with ADAS and/or infotainment functionality.

Vehicles utilizing advanced driver-assistance systems ("ADAS"), which provides varying levels of driver assistance (e.g., adaptive cruise control ("ACC"), may incorporate error detection and/or correction functions to detect errors in raw data. In some examples, the raw data may data to be used in the ADAS functions. For example, the raw data may come from raw data sources such as radars, lidars, cameras, or wireless receivers. The error detection and/or functions may be operated via error detection and correct code ("ECC").

For example, a vehicle may include a first error detection and/or correction path (e.g., a collection of circuits performing a first sequence of error detection and/or correction) to perform the ECC function on the raw data. The ECC function may detect an (ECC) error in the raw data. The ECC error in the raw data may be referred to as an actual ECC error.

However, a malfunction may develop in the ECC function itself (e.g., a malfunction in the first error detection and/or correction path). To test the first error detection and/or correction path for fault (e.g., a fail) that developed therein, the vehicle may have to take the first error detection and/or correction path offline to detect the fault in the ECC function. Such offline testing may be inconvenient to the user of the vehicle and may lead to safety issues.

Presented herein, the vehicle may further include a second error detection and/or correction path (e.g., a collection of circuits performing a second sequence of error detection and/or correction different from that of the first path). For example, the second error detection and/or path may be configured to determine an ECC error being resulted from a malfunction in the first error detection and/or correction path, while the first error detection and/or correction path is online. In some examples, online may refer to that the first error detection and/or correction path is in operation to perform an ECC function on raw data. For example, the ECC function performed by the first error detection and/or correction path is not halted. In some examples, the first error detection and/or correction path is not taken offline, suspended, or put into the different mode for the second error detection and/or correction path to detect the ECC error resulted from the malfunction in the first error detection and/or correction path (e.g., a malfunction in the ECC function). In such fashion, both the ECC function (e.g., performed by the first error detection and/or correction path) and the malfunction detection of the ECC function (e.g., performed by the second error detection and/or correction path) may operate in parallel. For example, the first error detection and/or correction path and the second error detection and/or correction path may both be online (e.g., both in operation) in a same time period. The second error detection and/or correction path may be configured to detect a malfunction in the first error detection and/or correction by performing test on the same or a copy of the same raw data operated on by the first second error detection and/or correction path.

FIG. 1 illustrates a block diagram of a system 100 configured to perform online ECC function and online malfunction detection of the ECC function. The system 100 may be incorporated within, for example, a computer, a mobile computing device, and/or a vehicle. An SoC 102 contains a number of subsystems and logical blocks that enable functionality within a mobile computing device. In some examples, the SoC 102 may refer to a collection of circuits, software operating the circuits, or a combination thereof. A central processing unit ("CPU") 110 may be electronically coupled to various components within the SoC 102 via a bus 116. The bus 116 could be a logical fabric, a physical fabric, a network on chip ("NoC"), or any number of equivalent communication channels (or "interconnects"). A static random-access memory ("SRAM") 112 may be electronically coupled via the bus 116 to the various components within the SoC 102. SRAM 112 is a type of semiconductor memory that uses bistable latching circuitry and is typically used for CPU-related caching operations. A read-only memory ("ROM") 114 may be electronically coupled via the bus 116 to the various components within the SoC 102. The ROM 114 may contain data accessible by the CPU 110, including boot-related code and/or instructions.

A digital signal processor ("DSP") 167 may be electronically coupled via bus 116 to the various components within the SoC 102. The DSP 167 may be used to measure, to filter, and/or to compress continuous real-world analog signals. Many of the algorithms configured within the DSP 167 may be configured to being executed on the CPU 110. However, the DSP 167 may have better power efficiency and higher performance for certain operations. As such, the system may allocate a first set of operations to the CPU 110 and a second set of operations to the DSP 167 such that the advantages of both processing units can be utilized. The first set of operations and the second set of operations may be coextensive and/or related.

A power management interface 118 may be connected via a bus 124 to a power management controller 108. Likewise, the power management interface 118 may be electronically coupled via the bus 116 to the various components within the SoC 102. The power management controller 108 may be used by the mobile computing device to power several SoCs (e.g., the SoC 102).

A RAM controller 121 may be electronically coupled via bus 125 to a RAM 105. Likewise, the RAM controller 121 may be electronically coupled via the bus 116 to the various components within the SoC 102. The RAM 105 may be used for operational storage of data and executable code while the SoC 102 is in operation.

A storage memory controller 122 may be electronically coupled via bus 128 to a storage memory 106. Likewise, the storage memory controller 122 may be electronically coupled via the bus 116 to the various components of the SoC 102. The storage memory 106 may be used for operational storage of data, non-operational storage of executable code while the SoC 102 is in operation or powered down.

An external processor 140 may be electronically coupled to an I/O controller 199, within SoC 102, via a bus 142, allowing communication between the external processor 140 and the SoC 102. Further, the external processor 140 and the SoC 102 may selectively share resources within their respective domains. Communication between the external processor 140 and the SoC 102 may include bidirectional transmission of control signals, status messages, and/or other data. Shared resources between the SoC 102 and the external processor 140 may include any internal state or functional feature (e.g., permanent read-only memory, volatile memory, non-volatile memory, processors, accelerators, engines, etc.) In one aspect, the external processor 140 may be yet another example of the SoC 102. In another aspect, the external processor 140 may be a processor configured for a host of specialized tasks that supplement the functionality of the SoC 102 (e.g., application processing, graphic processing, etc.). Modern mobile computing devices have a multiple SoCs, processors, memories, etc.

External processor 140 is further shown to emphasize that yet another SoC and/or processor may need to interact with the SoC 102 to achieve a desired functionality of the mobile computing device (e.g., communicating over cellular networks, capturing video/images, playing three-dimensional games, etc.). For example, external processor 140 may be a graphics processing unit ("GPU") configured to provide graphical processing assistance to the SoC 102. In another example, the external processor 140 may be a cellular communication SoC configured to enable wireless communication of the mobile communication device via the SoC 102. In still another example, the external processor 140 may have operations relating to the safe operation of a vehicle in which the SoC 102 and the external processor 140 are collectively embedded. In such an example, the external processor 140 may support ADAS functionality and likewise may need to adhere to ADAS-related safety and/or operational standards (described further herein).

Figure 2A:
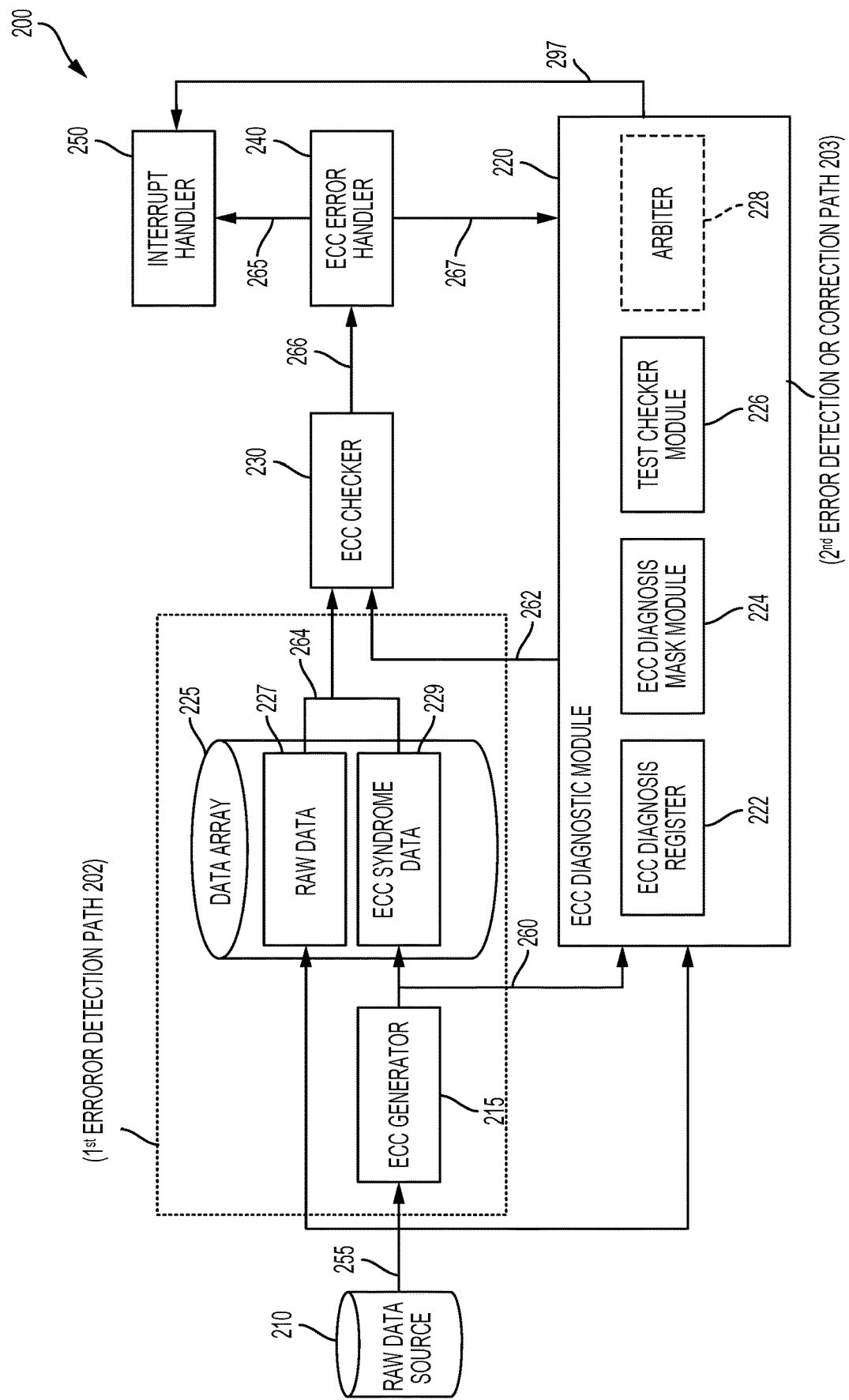
FIG. 2A illustrates a block diagram of another system configured to perform online ECC function and online malfunction detection of the ECC function.

FIG. 2A a block diagram of another system 200 configured to perform online ECC function and online malfunction detection of the ECC function. The system 200 may be embedded within the RAM controller 121 of the SoC 102, described above in FIG. 1. The malfunction detection of the ECC function may be performed with respect to a memory (e.g., the RAM 105; see FIG. 1). In some examples, the system 200 may be embedded within the bus 116 (FIG. 1) such that the interconnect could utilize the functionality provided by the system 200 to correct errors moving through the bus 116. Further, the system 200 may be electronically coupled to the SRAM 112 such that the malfunction detection of the ECC function may be used for cache-stored data. In one aspect, the cache-stored data may be accessed by the CPU 110 (FIG. 1). In another aspect, the cache-stored data may be accessed by the DSP 167 (FIG. 1). In either aspect, the malfunction detection of the ECC function may be utilized.

The system 200 may be electronically coupled to a raw data source 210. In one aspect, the raw data source 210 may be the storage memory 106 (see FIG. 1). In another aspect, the raw data source 210 may be a flow of data coming from the external processor 140 (FIG. 1). For instance, the external processor 140 may control a back-up camera for a vehicle; the data in the raw data source 210 may be images captured by the back-up camera. In yet another aspect, the raw data source 210 may have multiple sources (and corresponding destinations). In yet another aspect, the raw data source 210 may refer to radar, lidar, camera, wireless receiver or other sources of data for ADAS.

In one aspect, the system 200 may include a first error detection and/or correction path 202 to perform ECC function on raw data 227 (e.g., the data for ADAS functions). The first error detection and/or correction path 202 may include at least a memory (e.g. a data array 225) and an ECC syndrome data generating module (e.g., an ECC generator 215). In some examples, ECC syndrome data may be data generated from the raw data for the ECC function. The system 200 may further include the second error detection and/or correction path 203, which may include at least an ECC diagnostic module 220 or any of the modules thereof. The modules or elements of the system 200 (e.g., the ECC syndrome data generating module) may be implemented by circuits, software, a processor, or a combination thereof.

The data array 225 may be a memory, such as the RAM 105, in one aspect. The raw data source 210 is connected via the bus 255 to the data array 225, the ECC generator 215, and the ECC diagnostic module 220. The data array 225 may be configured to store raw data 227, received from raw data source 210 via the bus 255. The data array 225 may further be configured to store ECC syndrome data 229 received from the ECC generator 215 via bus 260. The ECC syndrome data 229 may be configured to generate the ECC syndrome data 229, which may be derived from the raw data 227 (e.g., for error detection and/or correction of the raw data 227). The ECC generator 215 may implement the ECC syndrome data logic in a number of different manners, such that fewer or more errors are detected. For example, the ECC generator 215 may be implemented to generate a hash that may detect errors in two bits of the raw data 227, but only be configured to correct one of those erroneous bits. As the number of detectable and correctable errors increases, the complexity of the ECC generator 215 may need to correspondingly increase. The operational environment of the system 200 (e.g., the ADAS function) may be evaluated to determine the proper number of bits to check with the ECC generator 215.

The ECC syndrome data 229, derived from the raw data 227 by the ECC generator 215, may be stored in the data array 225. Such ECC syndrome data 229 may be communicated via a bus 260 to the data array 225. An example of the raw data may include data provided to the data array 225 for error detection and/or correction and to be used for ADAS functions. The data array 225 may be banks of dynamic random-access memory ("DRAM").

The ECC diagnostic module 220 may be configured to detect a malfunction in the first error detection and/or correction path 202 (e.g., detect a fault in the ECC function) for the system 200. First, the ECC diagnostic module 220 may generate test data for introducing or injecting a fault based on the raw data 227 and/or the ECC syndrome data 229. Further, the ECC diagnostic module 220 may be configured to verify that the created test data results in the ECC error being detected when such ECC error is in fact expected. The ECC diagnostic module 220 has an ECC diagnosis register 222, an ECC diagnosis mask module 224, a test checker module 226, and an arbiter 228.

The bus 260 communicates the ECC syndrome data 229 (e.g., a portion thereof) to the ECC diagnostic module 220. Within the ECC diagnostic module 220, the ECC diagnosis register 222 may store the ECC syndrome data 229 (or portion thereof). The raw data 227 and the ECC syndrome data 229 contained in the data array 225 may duplicate in part the data stored in the ECC diagnosis register 222. Further, the storage capacity of the data array 225 may be significantly larger than the storage capacity of the ECC diagnosis register 222. A balance of competing resources within the SoC's 102 implementation may need to be found where the ECC diagnosis register 222 has enough raw data 227 and ECC syndrome data 229 to perform a robust check of the ECC function within the system 200.

As described above, the ECC diagnosis register 222 may be referred to as a second memory to differentiate from the memory of the data array 225. In one aspect, the ECC diagnosis register 222 may store at least a portion of the raw data 227 and/or the ECC syndrome data 229 stored in the data array 225. The amount of data held in the ECC diagnosis register 222 may be equal to or less than the entire amount of data stored in the raw data source 210 (or the data array 225). One advantage of the ECC diagnostic module 220 having actual raw data stored in the ECC diagnosis register 222 is that the system 200 can provide malfunction detection on the ECC function (performed by the first error detection and/or correction path 202) on the same raw data being passed through the ECC function. Such use of actual data may be demanded by the makers of vehicles because the actual data may cover more real-world scenarios, whereas synthetic data (e.g., may be known as test data) may not fully exercise the system 200.

The ECC diagnosis mask module 224 may contain data and functionality relating to the desired ECC test patterns to be performed on the data (e.g., the raw data 227 and/or the ECC syndrome data 229) within the ECC diagnosis register 222. Bit inverter logic may be within the ECC diagnosis mask module 224 such that test bits can be altered to create a test scenario for test by the system 200. For example, a particular data mask may be configured to create an ECC error relating to two bits wherein both bits are detected as erroneous but only one may be actually correctable via ECC.

In one aspect, the ECC diagnosis mask module 224 may be configured to generate a known ECC error from the ECC syndrome data 229 and the raw data 227 stored in the ECC diagnosis register 222. For example, the ECC diagnosis mask module 224 may be updatable by software patches (e.g., may be known as flashes) that enable the augmentation or reduction of particular test patterns and/or scenarios. For example, the ECC diagnosis mask module 224 may output the mask as a stream of bits. An "1" in the stream data, when combined with the ECC syndrome data 229, may toggle the corresponding bit in the raw data 227 or the ECC syndrome data 229. In one example, one data bit may be toggled. Since ECC syndrome data 229 was generated based on the actual raw data (e.g., subject of the ECC function), toggling one bit may create a single error at the output (e.g., bus 266) of the ECC checker 230. The ECC diagnostic module 220 may be configured, for example, by software as a single error form checker. Both the mask and the expected results in the ECC diagnostic module 220 may come from the software and may be related. If the software sets two-bit toggle in data, the software may set the expected result in the ECC diagnostic module 220 to double error detection from the output of the ECC checker 230 (discussed in further details below). The ECC checker 230 may output different error status: (1) no error, (2) one-bit correctable error, (3) two-bit uncorrected error, and (4) ECC bit toggle. In such fashion, the ECC checker 230 may output various error status based on the implementation and capability of how many errors the ECC checker 230 may detect. The ECC diagnostic module 220 may be configured by software to expect the output error status for each mask pattern. The mask pattern may likewise be programmable by software. Vehicles are expected to last closer to 200,000 miles. If a user drives 12,000 miles per year, then the vehicle may likely be in operation more than fifteen years. As such, providing the ability to dynamically update the tests within the ECC diagnosis mask module 224 provides further reliability and duration for the vehicle in which the system 200 is disposed.

The test checker module 226 is generally configured to verify the results of an ECC-based test generated by the ECC diagnostic module 220. The arbiter 228 is generally configured to enable the ECC diagnostic module 220 to serve multiple blocks of logic which rely on ECC. For example, the data array 225 may be several banks of DRAM which are disposed across the mobile computing device (or vehicle). The arbiter 228 may enable the reuse of the ECC diagnostic module 220 for several streams and/or stores of data. Recall that the ECC diagnosis register 222 may store data and ECC syndrome data from any source configured to generate such data. As such, the arbiter 228 may communicate with the ECC diagnosis register 222 to actively select what data should be stored therein such that the ECC diagnostic module 220 can serve the source of the stored data. In one aspect, the test checker module 226 may trigger the interrupt 297 and provide the interrupt 297 to the interrupt handler 250. Additional details of the interrupt 297 will be presented below with FIG. 2B.

In one aspect, the test checker module 226 may contain information relating to when a test should and should not be performed. In one aspect, the test checker module 226 may not perform any ECC-related tests unless the system 200 receives input indicating an ECC test is in fact desired. In another aspect, the test checker module 226 may need to wait for an opportunity to test the system 200 such that the operation of the mobile computing device (or vehicle) is not interrupted. For example, the test checker module 226 may wait until no data is being accessed (e.g., read or written) such that the ECC tests and/or the ECC function malfunction detection described herein may be performed. In yet another aspect, the test checker module 226 may be configured to control the flow of information into the system 200 by manipulating quality-of-service ("QoS") parameters that exist in the mobile computing device (or vehicle). For example, the test checker module 226 may reduce the incoming data writes and reads, such as the QoS parameter, such that a sufficient window of time is provided to test the ECC functionality and/or to detect malfunction of the ECC function of the system 200.

The ECC checker 230 may be configured to detect an ECC error (e.g., as part of the ECC function or as part of the malfunction detection). The raw data 227 and the ECC syndrome data 229 stored in the data array 225 may be communicated via the bus 264 to the ECC checker 230. For example, the ECC checker 230 may contain logic configured to determine whether or not the raw data 227 checks with the ECC syndrome data 229 (both received on the bus 264), as part of the ECC function to detect an actual ECC error in the raw data 227. A bus 262 connects the ECC diagnostic module to the ECC checker 230 as well. Therefore, the ECC checker 230 may operate on either the data being transmitted from the data array 225 or from the ECC diagnostic module 220. For example, the ECC checker 230 may include a multiplexer to select the bus 264 or the bus 262 as an input. The ECC checker 230 may select the bus 264 for the raw data 227 and the ECC syndrome data 229 stored in the data array 225 to process the ECC function (e.g., to detect an actual ECC error in the raw data 227 as part of the ECC function). Periodically (e.g., not continuously), the ECC checker 230 may select the bus 262 for data from the ECC diagnostic module 220 to detect a malfunction in the ECC function. The malfunction in the ECC function may be within the memory (data array 225) and/or the ECC syndrome data generating module (the ECC generator 215) of the first error detection and/or correction path 202. For example, the ECC checker 230 may detect an ECC error from the bus 262 (from the ECC diagnostic module 220), and the ECC error detected may correspond to an expected error flowing from the fault injected based on the raw data 227 and/or the ECC syndrome data 229. For example, the expected error may be the one introduced via the ECC diagnosis mask module 224. In a case that the ECC checker 230 detects an ECC error from the bus 262 that does not correspond to an expected error, the detected ECC error in this case may be resulted from a malfunction of the ECC function. For example, the ECC error may be resulted from a fault or failure in the memory (e.g., the data array 225) or the ECC syndrome data generating module (e.g., the ECC generator 215). In such fashion, the ECC checker 230 may detect an ECC error as part of the ECC function (e.g., detecting an actual ECC error in the raw data 227 via the bus 264) and, alternately and/or periodically, as part of the malfunction detection of the ECC function (via the bus 262).

The ECC checker 230 may be connected via bus 266 to an ECC error handler 240. In one aspect, the ECC error handler 240 may be a first-in-first-out error queue that manages ECC-related errors in the raw data 227 (e.g., actual ECC errors). The ECC error handler 240 may be connected via bus 265 to an interrupt handler 250, which may be connected to various downstream components of the system 200 (e.g., the external processor 140 of FIG. 1, configured to perform the ADAS functions). In one aspect, the ECC error handler 240 may detect an error and create an interrupt across the bus 265 to the interrupt handler 250 to signal the error to the downstream components.

Turning back to the ECC error handler 240, a bus 267 may connect the ECC error handler 240 to the ECC diagnostic module 220. In one aspect, the bus 267 may communicate ECC-related information similar to the interrupt data sent to the interrupt handler 250. However, the ECC diagnostic module 220 may utilize such interrupt data to further diagnose the ECC-related information. For instance, the ECC-related information may be expected if the ECC diagnostic module 220 had started a process to create an expected error and determine whether the system 200 is configured to detect the expected error. Depending on the system's 200 ability to accurately check for errors, the interrupt to the interrupt handler 250 may be ignored since the error may have been generated simply to test the ECC function of the system 200. The ability of the ECC error handler 240 to be configured to handle both "normal" data flow from the data array 225 (the ECC function) as well as ECC diagnostic data from the ECC diagnostic module 220 (detecting a malfunction in the ECC function). Further, such configuration substantially enables the system 200 to selectively and/or periodically (e.g., not continuously) test ECC-related functions/operations while the system 200 is processing raw data 227 for the purpose of achieving the mobile computing device's intended functionality (e.g., controlling an ADAS-related system within a vehicle).

Further, the interrupt handler 250 may communicate with the SoC 102 or the external processor 140 as necessary. Further, there may be subsystems and components within the mobile computing device (or vehicle) to which the interrupt handler 250 further communicates.

Figure 2B:
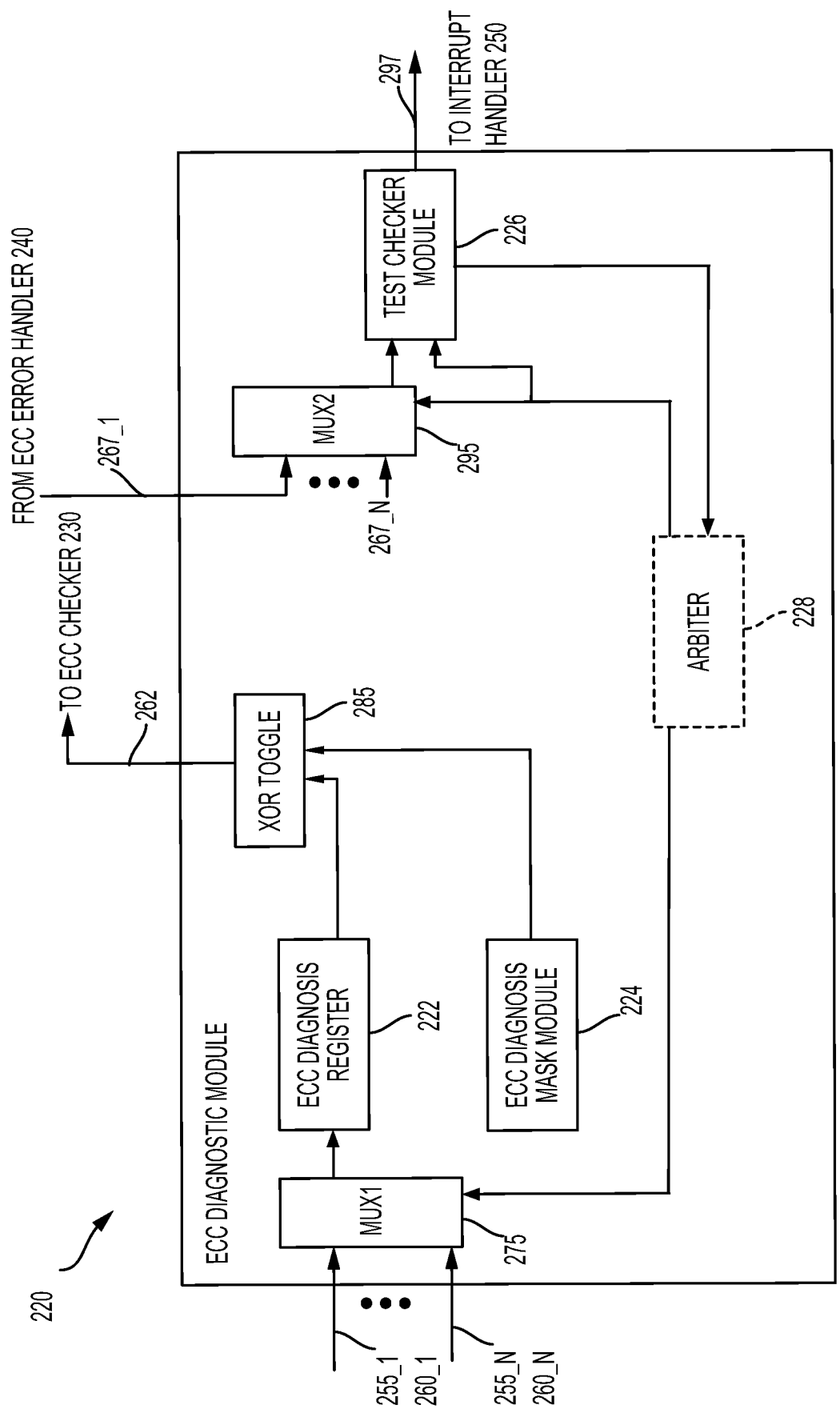
FIG. 2B is a block diagram of an ECC diagnostic module.

FIG. 2B is a block diagram of an ECC diagnostic module 220 (presented with FIG. 2A), in accordance with aspect of the present disclosure. In the example, the ECC diagnostic module 220, as presented in FIG. 2A, is further configured to operate with multiple raw data sources 210 (FIG. 2A) outputting to bus 255_1 to bus 255_N and multiple ECC generators 215 (FIG. 2A) outputting to bus 260_1 to bus 260_N. The multiple raw data sources 210 and the multiple ECC generators 215 are not shown for clarity. A multiplexer 275 (labeled MUX1) may receive and select one of the buses 255_1-bus 255_N and one of the buses 260_1-260_N. The selected ones of the 255 buses and of the 260 buses are provided to the ECC diagnosis register 222.

An XOR toggle 285 may receive the output (e.g., the data and the ECC syndrome) from the ECC diagnosis register 222 and the output (e.g., the mask data stream) from the ECC diagnosis mask module 224. The XOR toggle 285 may apply the mask stream data to the data and the ECC syndrome from the ECC diagnosis register 222 via, for example, the XOR function. For example, the XOR function may flip the bit or bits in the ECC syndrome data 229 (FIG. 2A) where the mask stream data is a "1" to introduce or inject a fault at the output of the XOR toggle 285, in accordance with the mask stream data from the ECC diagnosis mask module 224. In such fashion, the ECC diagnosis mask module 224 may generate an expected ECC error flowing from the injected fault based on the raw data 227 and/or the ECC syndrome data 229 stored in a second or different memory (e.g., the ECC diagnosis register 222), in reference to the memory (e.g., the data array 225) of the ECC function. For example, the memory (e.g., the data array 225) may be of different memory locations from the second memory (e.g., the ECC diagnosis register 222) within a same physical memory. In another example, the memory and the second memory may be two different physical memories.

A multiplexer 295 (labeled MUX2) may be configured to receive multiple buses 267_1-267_N from corresponding ECC error handlers 240 (see FIG. 2A for reference). The multiple ECC error handlers 240_1-240_N are not shown for clarity. The arbiter 228 may control the selection of the multiplexer 275 and the multiplexer 295 to select a subsequent ECC generator 215 (FIG. 2A)(e.g., among the multiple ECC generators 215) for testing, based on the test checker module 226. The arbiter 228 may notify the test checker module 226 of, for example, a bank number of the memory of the data array 225 (FIG. 2A) under test. The test checker module 226 may receive the selected output of one of the ECC error handlers 240_1-240_N and determine whether the memory of the data array 225 under test has failed. For example, the test checker module 226 may be configured to determine whether the ECC error detected by the ECC checker 230 corresponds to the expected ECC error (resulted from the fault injected by the ECC diagnosis mask module 224) or to a malfunction of the ECC function. The ECC function may include detecting an actual ECC error in the raw data 227 performed by the first error detection and/or correction path 202.

The detected ECC error may be resulted from a malfunction of the ECC function. For example, the test checker module 226 may receive information on the expected error flowing from the fault introduced/injected by the ECC diagnosis mask module 224 via software, or direct the ECC diagnosis mask module 224 to introduce the fault via the mask stream. In a case that the test checker module 226 determines that the ECC error detected by the ECC checker 230 corresponds to the expected error, the test checker module 226 may determine or recognize that the first error detection and/or correction path 202 is performing the ECC function properly. In a case that the test checker module 226 determines that the ECC error detected by the ECC checker 230 does not correspond to the expected error, the test checker module 226 may determine or recognize that the detected ECC error corresponds to a malfunction of the ECC function. The malfunction of the ECC function may indicate or is resulted from a malfunction in the first error detection and/or correction path 202. For example, a fail or a fault (malfunction) in the memory (e.g., the data array 225) or the ECC syndrome data generating module (e.g., the ECC generator 215) may result in the malfunction of the ECC function.

In response to determining the ECC error detected by the ECC checker 230 corresponds to the malfunction of the ECC function, the test checker module 226 may output an interrupt 297 to inform the system 200 of the failure (e.g., to inform that there is a malfunction in the ECC detection path, such as the memory of the data array 225). For example, the interrupt 297 may be provided to the interrupt handler 250 or provided to various downstream components of the system 200 via the interrupt handler 250. The interrupt handler 250 may determine whether a received interrupt corresponds an actual error resulted from the normal ECC function (e.g., received from the ECC error handler 240 via the bus 265) or resulted from a fault in the ECC function (e.g., received from interrupt 297). Certain downstream components of the system 200 (e.g., the external processor 140 performing the ADAS functions) may, in response to the interrupt 297, invoke safety-related measures to ensure safe operation for the user. Such safety-related measures may include notifying (e.g., via display or other means) the user (e.g., the driver or a service facility) of the system malfunction in response to detecting a malfunction of the ECC function (e.g., determining that the detected ECC error corresponds to a malfunction of the ECC). For example, while the back-up camera is in operation, the vehicle (incorporating the system 100 (see FIG. 1) or the system 200 (see FIG. 2)) detecting a malfunction of the ECC function may display warning on the camera display to warn the user (e.g., the driver) of a system malfunction and to not rely on the back-up camera. In another example, a mobile computing device (incorporating the system 100 (see FIG. 1) or the system 200 (see FIG. 2)) may notify a user of a system malfunction using the display or speaker of the mobile computing device, in response to detecting a malfunction of the ECC function.

In one aspect, the system 200 may further test whether the ECC generator 215 (FIG. 2A) is working properly via software. For example, the system 200 may read (e.g., via software) the ECC diagnosis register 222, which may contain both the raw data 227 and the generated corresponding ECC syndrome data 229. The system 200 may, for example, determine whether the ECC generator 215 is working properly (e.g., via software) by examining the raw data 227 and the ECC syndrome data 229 (see FIG. 2A). The testing of the ECC generator 215 may be performed in parallel with any regular or testing operations or ECC functions. For example, the testing of the ECC generator 215 (part of the ECC function) may be testing performed in parallel with the operations of the ECC checker 230 (FIG. 2A) and/or the ECC diagnostic module 220. In such fashion, the system 200 may test the functionality of the ECC generator 215 without negatively impacting the performance or QoS of the system.

As presented with FIGS. 2A and 2B, the system 200 may include a first error detection and/or correction path 202 (e.g., a collection of circuits performing certain sequence of processing) for ECC function. The first error detection and/or correction path 202 may include a memory (data array 225) configured to store the raw data 227 and/or the ECC syndrome data 229. The system 200 may include a second error detection and/or correction path 203 (e.g., a second collection of circuits performing a different sequence of processing) to detect a malfunction in the first error detection and/or correction path. The second error detection and/or correction path may include a register (e.g., the ECC diagnosis register 222) configured to store at least in part the raw data 227 and/or the ECC syndrome data 229. In one aspect, the ECC diagnosis register 222 may store at least a duplicate portion of the data array 225. The second error detection and/or correction path 203 may include a module (e.g., the ECC diagnosis mask module 224) for injecting a fault to produce an expected ECC error based on the raw data 227 and/or the ECC syndrome data 229 stored in the ECC diagnosis register 222.

In one aspect, the second error detection and/or correction path 203 may operate in the background and/or in parallel with the first error detection and/or correction path 202. The system 200 needs not to suspend the first error detection and/or correction path 202 for the second error detection and/or correction path 203 to operate (e.g., the first error detection and/or correction path 202 remains online). The second error detection and/or correction path 203 thus may detect a malfunction in the first error detection and/or correction path 202 (e.g., by testing on the same raw data 227 and/or the ECC syndrome data 229 subject to the ECC function) without software intervention and without suffering performance penalty. In the example presented with FIGS. 2A and 2B, the system 200 shares the ECC checker 230 and the ECC error handler 240 for ECC function and the malfunction detection of the ECC function. Such sharing is an example and not limitation, In one aspect, the memory of the data array 225 may function as a cache (e.g., of the CPU 110; see FIG. 1). The malfunction detection of the ECC function may include injecting a fault on a test address in memory, and that address may not be usable by software. Such scheme may not work in the case that the memory of the data array 225 functions as a cache, as the software may not have access to cache based on memory address (that is, the usage of cache is not easily determined). The system 200 described with FIGS. 2A and 2B, however, may function even in the case that the memory of the data array 225 functions as a cache by testing on a copy of at least of a portion of the raw data 227 and the corresponding ECC syndrome data 229.

Figure 3:
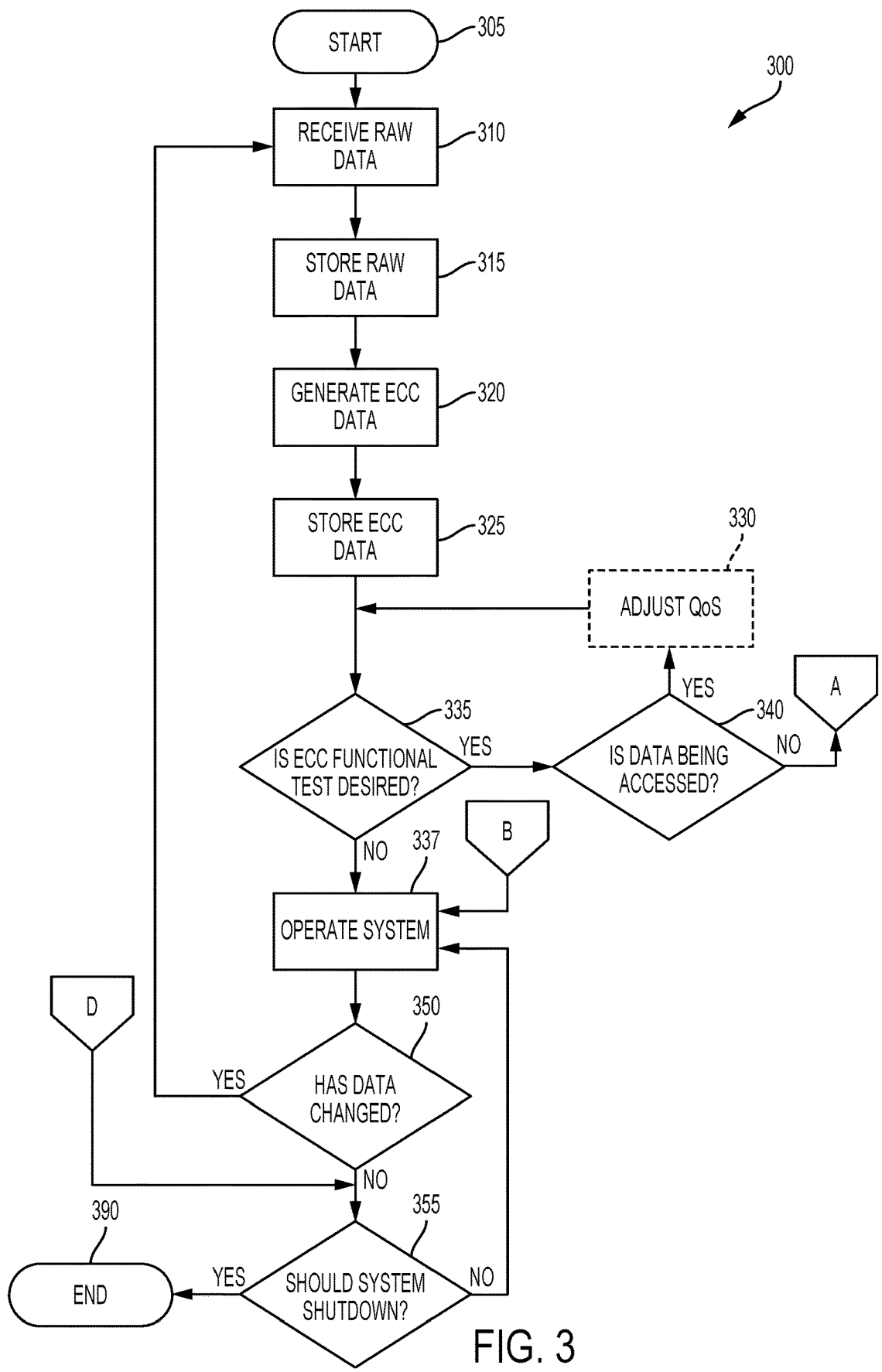
FIG. 3 is a flowchart illustrating a process for determining and invoking an online malfunction detection of the ECC function.

FIG. 3 is a flowchart illustrating a process 300 for determining and invoking an online malfunction detection of the ECC function. The process 300 begins at START block 305. The process 300 then proceeds to the block 310 where the raw data 227 is received. Referring to FIG. 2A, the raw data 227 may originate in the raw data source 210 and be passed to the ECC generator 215, the data array 225, and the ECC diagnostic module 220. The process 300 then proceeds to the block 315.

At the block 315, the raw data 227 is stored within the data array 225. In one aspect, at least a portion of the raw data 227 may be stored in the ECC diagnosis register 222 (FIG. 2A) such that the raw data 227 (or portion thereof) may be utilized for subsequent ECC tests by the system 200 (FIG. 2A). The process then proceeds to the block 320.

At block 320, the ECC generator 215 creates the necessary ECC syndrome data 229 (FIG. 2A) corresponding to the raw data 227 as stored in the data array 225. The process 300 then proceeds to the block 325.

At the block 325, the ECC syndrome data 229 may be stored in the data array 225 (e.g. a memory for the ECC function). In one aspect, the storing of the ECC syndrome data 229 in the data array 225 would be consistent with the normal ECC function of the system 200. In another aspect, the ECC syndrome data 229 (or portion thereof) may be stored in the ECC diagnosis register 222 (e.g., a second or different memory) such that the ECC diagnostic module 220 may conduct ECC function malfunction detection via the system 200. For example, the ECC syndrome data 229 may be stored in the second memory for generating an expected ECC error by injecting a fault based on the raw data 227 and/or the ECC syndrome data 229 stored in the second memory (as presented with FIG. 2B) to test the ECC function via the ECC diagnostic module 220. The process 300 then proceeds the decision block 335.

At the decision block 335, a determination is made as to whether an online ECC functional test is desired. For example, the online ECC functional test may include the ECC function malfunction detection. In one aspect, the system 200 may receive an indication from the SoC 102 (FIG. 1) to begin the online ECC functional test performed by the ECC diagnostic module 220. In one aspect, the determination to conduct the ECC functional test may be simply based on a period timer. In another aspect, the ECC functional test determination may be the result of a previously failed attempt by the process 300 to conduct the ECC functional test; for example, the process 300 may have had to wait to conduct the test because data was being written or read from the data array 225. Therefore, a number of a factors may contribute to the determination in the block 335.

If the determination to conduct the ECC functional test is in the affirmative, the process 300 proceeds along the YES branch to the decision block 340.

At the decision block 340, the process 300 determines whether the raw data 227 in the data array 225 is being accessed (e.g., read or written). If the raw data 227 is not being accessed, the process 300 proceeds along the NO branch to the reference block A, which continues on FIG. 4 below.

Returning back to the decision block 340, if a determination is made that the data is being accessed, then the process 300 proceeds along the YES branch to the block 330. At the block 330, the system 200 may send signals to the SoC 102 (or the external processor 140; see FIG. 1) to indicate that the QoS parameter or parameters should be adjusted such that a larger window without access (e.g., read or write) to the raw data 227 is provided. With a larger window without access, the process 300 may have a higher likelihood of invoking the online malfunction detection of the ECC function. The ADAS may have a fault tolerant time interval ("FTTI") of approximately two hundred fifty milliseconds (250 ms). In general, the 250 ms FTTI is adequate to provide an online malfunction detection of the ECC function. The QoS parameter may be adjusted such that the 250 ms FTTI is not exceeded. Otherwise, there may be a violation of ADAS requirements and potential serious injury to users, including the loss of life. Note that the block 330 is illustrated with dotted lines indicating that the operations therein may or may not be utilized by the process 300, depending on how the process 300 (and its corresponding systems 100, 200) is deployed. In such fashion, the checking of an ECC error may be delayed until the raw data 227, receive based on the QoS parameter, is not being accessed. If the delaying the checking of the ECC error is in excess of a fault-tolerant deadline (e.g., the 250 ms FTTI), the QoS parameter may be adjusted to reduce the delaying of the checking of the ECC error.

The process 300 then proceeds to connect back to the decision block 335. Some actual time may have passed while the adjustment to the QoS parameter in the block 330 occurred, since the adjustment in the QoS parameter may take some time to provide an adequate window of time for the process 300 to perform the online malfunction detection of the ECC function.

The process 300 then proceeds to the block 337. At the block 337, the process 300 operates the system 100 (FIG. 1) or the system 200 according to the normal operation of the mobile computing device (or vehicle) in its designated real-world context. For example, the operations in the block 337 may be related to operating an adaptive cruise control system that allows a vehicle to follow another vehicle at a predetermine distance or speed with minimal user interaction. The process 300 then proceeds to the decision block 350.

At the block 350, a determination is made as to whether to update the ECC syndrome data 229 due to the raw data 227 being updated. Events which had happened during the operation of the system 200 in the block 337 may change the raw data 227. As such, the ECC syndrome data 229 may need to be updated in order to maintain the integrity of both the raw data 227 itself and the ECC-related functionality. If the ECC syndrome data 229 should be updated, then the process 300 proceeds along the YES branch to the block 310 where the process 300 continues as previously described.

Returning to the decision block 350, if the ECC syndrome data 229 does not need to be updated, the process 300 proceeds along the NO branch to the decision block 355. At the decision block 355, the process 300 determines whether the system 200 should shut down. A number of factors beyond the scope of this description may influence the need to shut down the system 200. For example, the mobile computing device (or vehicle) may simple be turned off by user command (e.g., the user parks the vehicle and turns off the engine). Another example could be a catastrophic event within the mobile computing device (or vehicle) that causes the mobile computing device (or vehicle) to shut down abruptly (e.g., a high-speed collision with a concrete barrier). If the mobile computing device (or vehicle) is to remain in operation, then the process 300 proceeds along the NO branch to the block 337 where the process 300 operates the device as described in the block 337.

Returning to the decision block 355, if the process 300 determines that the mobile computing device (or vehicle) should shut down, the process 300 proceeds along the YES branch to the END block 390, at which point the process 300 terminates.

Figure 4:
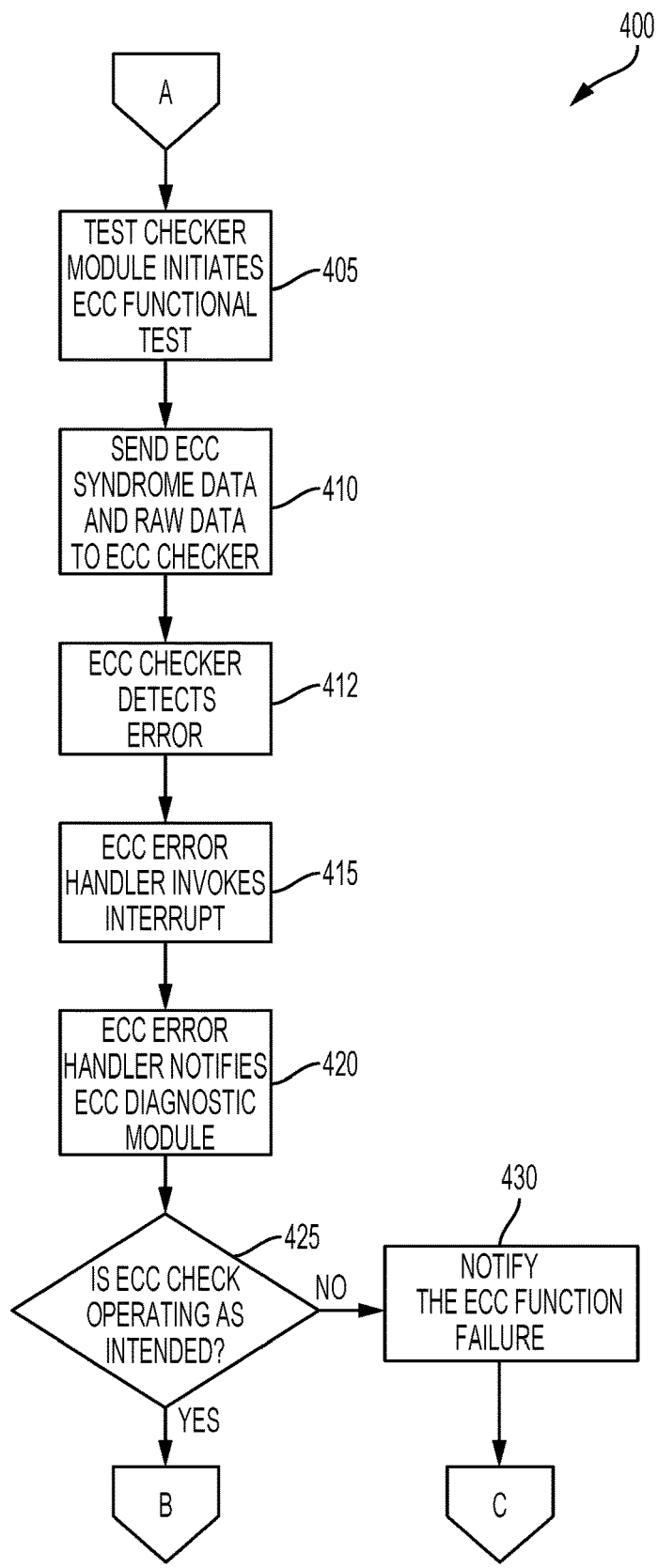
FIG. 4 is a flowchart illustrating a process for conducting an online malfunction detection of the ECC function.

FIG. 4 is a flowchart illustrating a process 400 for conducting an online malfunction detection of the ECC function. The process begins at reference block A, which originated in FIG. 3 as described above. The process 300, referenced with FIG. 3, may be implemented as part of the process 400. Likewise, the processes 300, 400 may be comprised of further sub-processes that are not depicted herein but are consistent with the spirit and scope of this description. The process 400 proceeds to the block 405.

At the block 405, the ECC diagnostic module 220 (FIG. 2A), within the ECC diagnostic module 220 (FIG. 2A), initiates an ECC functional test (e.g., to detect a malfunction of the ECC function). The ECC diagnostic module 220 may utilize the raw data 227 (or portion thereof; see FIG. 2A) and the ECC syndrome data 229 (or portion thereof; see FIG. 2A) within the ECC diagnosis register 222 (FIG. 2A) to determine what the correct ECC syndrome data 229 should be for the raw data 227. The ECC diagnostic module 220 may then utilize the ECC diagnosis mask module 224 (FIG. 2A) to alter the ECC syndrome data 229 such that an expected ECC error condition is created. At this point in the process 400, the test checker module 226 has information sufficient to determine whether or not the results of the system's 200 ECC function is in fact operational or inoperative. The process 400 then proceeds to the block 410.

At the block 410, the ECC diagnostic module 220 sends the expected ECC error condition to the ECC checker 230 (FIG. 2A) via the bus 262 (FIG. 2A). The desired ECC error condition may be accompanied by the raw data 227 (or portion thereof) such that the expected ECC error condition may be utilized against data being used by the system 200 (FIG. 2A). The process 400 then proceeds to the block 412.

At the block 412, the ECC checker 230 detects and signals an error based on the expected ECC error condition (and associated raw data 227). Recall from above, the system 200 may be configured to generate expected ECC errors and pass them through existing ECC checking modules and components. The error detects and signals by the ECC checker 230 may be an expected ECC error flowing from the fault injected by the ECC diagnostic module 220, or an actual ECC error resulted from the ECC function (e.g., an error in the raw data 227).

For example, the ECC checker 230 may operate on either the data being transmitted from the data array 225 or the ECC diagnostic module 220. For example, the ECC checker 230 may include a multiplexer to select the bus 264 or the bus 262 as an input. The ECC checker 230 may select the bus 264 for the raw data 227 and the ECC syndrome data 229 to process the ECC function in a normal read case (e.g., to detect an ECC error in the raw data 227). Periodically (e.g., not continuously), the ECC checker 230 may select the bus 262 for data from the ECC diagnostic module 220 to process the ECC function malfunction detection (e.g., the malfunction of the ECC function may be, for example, a fail in the memory or in the data array 225). In such fashion, the ECC checker 230 may detect, alternately, an error resulted from the ECC function malfunction and an actual error from the ECC function. The process 400 then proceeds to the block 415.

At the block 415, the ECC error handler 240 may invoke an interrupt via the bus 265 (FIG. 2A). The process 400 then proceeds to the block 420 where the ECC error handler 240 may invoke a similar interrupt or message to the ECC diagnostic module 220 via the bus 267 (FIG. 2A). The process 400 then proceeds to the decision block 425.

At the decision block 425, the process 400 makes a determination as to whether the ECC check is operating as intended. Recall that at this point in the process 400, both the ECC error handler 240 and the ECC diagnostic module 220 have information substantially sufficient to determine whether the ECC error detected by the ECC checker 230 was indeed a malfunction of the ECC function (e.g., caused by a fault/fail in the memory or data array 225 or in the ECC syndrome data generating module; e.g., the ECC generator 215) or an expected error (e.g., corresponding a fault injected by the ECC diagnostic module 220 via the ECC diagnosis mask module 224)). If the ECC error, detected or outputted by the ECC checker 230 at the block 412, is an expected error generated by the ECC diagnostic module 220, the process 400 proceeds along the YES branch to the reference block B, which continues in FIG. 3. The existence of an expected ECC error may require some communication between the interrupt handler 250 (FIG. 2A) and the ECC diagnostic module 220 such that the interrupt received by the interrupt handler 250 is disregarded, since the ECC error was intentionally generated by the system 200 in order to functionally test the ECC function within the system 200. As previously stated, such an ECC functional test (e.g., malfunction detection) may be performed while the systems 100, 200 are in operation.

Returning to the decision block 425, if the ECC error detected by the ECC checker 230 at the block 412 corresponds to a malfunction of the ECC function (e.g., a fault/fail in the memory or data array 225 or in the ECC syndrome data generating module; e.g., the ECC generator 215 of the ECC function), then the process 400 proceeds along the NO branch to the block 430. At the block 430, the process 400 notifies the ECC function fail. For example, the system 200 may notify the downstream components, such as the external processor 140 performing the ADAS functions, of the malfunction of the ECC function. The malfunction of the ECC function may require further action by the mobile computing device (or vehicle) such that safe operation may continue. For example, the vehicle may notify the user (e.g., the driver or a service facility) of a system malfunction via a display, in response to the detecting the malfunction of the ECC function. The process 400 then proceeds to the reference block C, which is further described in FIG. 5.

Figure 5:
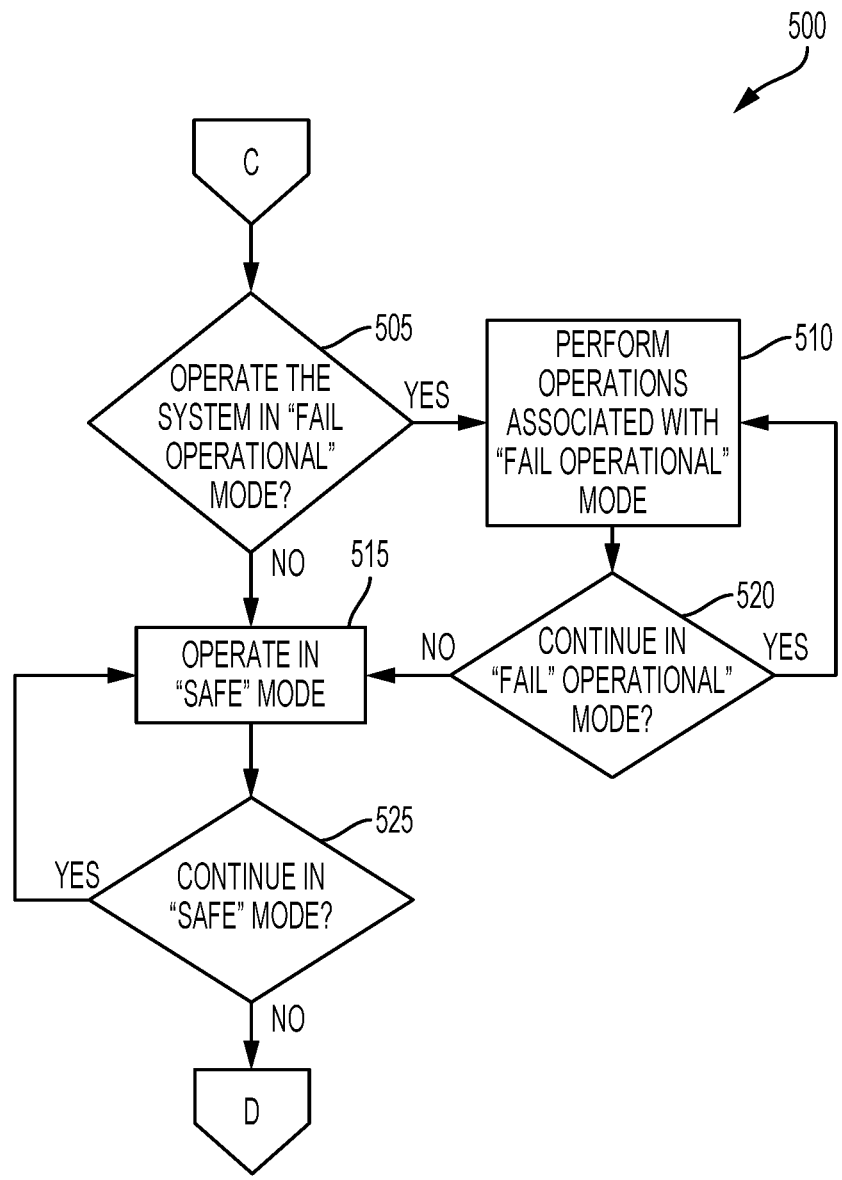
FIG. 5 is a flowchart illustrating a process for handling a malfunction detected during an online malfunction detection of the ECC function.

FIG. 5 is a flowchart illustrating a process 500 for handling a malfunction detected during an online malfunction detection of the ECC function. The process 500 may be implemented as part of the process 300 (FIG. 3), the process 400 (FIG. 4), or combination thereof. The processes 300, 400, 500 may be comprised of multiple sub-processes, which may be configured to carry out the operations of the processes 300, 400, 500. The process 500 begins at the reference block C and proceeds to the decision block 505.

At the decision block 505, a determination is made as to whether the mobile computing device (or vehicle) may continue to operate in "fail operational" mode. "Fail operational" mode is a generally related to ISO 26262 compliance, which addresses single point fault metrics ("SPFMs"), latent fault metrics ("LFMs"), probabilistic metric for hardware failures ("PMHF") for automotive safety integration levels ("ASIL"), etc. The determination at the block 505 may be carried out by a component downstream from the bus 265 (FIG. 2A). For example, the ECC error handler 240 may determine a malfunction has occurred within the system 200 in which case the ECC error handler 240 (FIG. 2A) may communicate the malfunction to other components within the mobile computing device (or vehicle)(e.g., via the interrupt handler 250; see FIG. 2A). However, when the malfunction is received by the mobile computing device (or vehicle), a determination may be made as to whether the malfunction requires transitioning to a "fail operational" mode or even a "safe" mode.

A "fail operational" mode is one that generally allows the mobile computing device (or vehicle) to substantially continue operation even though a malfunction has been detected; the goal of the "fail operational" mode may be to protect the users of the mobile computing device (or vehicle) because going to a "safe" mode (e.g., a complete shut down of the vehicle) would be potentially dangerous for the users or other bystanders. As way of example, a "fail operational" mode may be invoked if the malfunction reported by the system 200 (FIG. 2A) relates to adaptive cruise control. The vehicle may give haptic or audible warnings to the user such that the user becomes aware the adaptive cruise control is in "fail operational" mode. Further, the user may then safely navigate the vehicle to the side of the road and seek roadside assistance.

One the other hand, "safe" mode generally results in a system (or subsystem) being disabled, since the system (or subsystem) may not be reliably used and might lead to even greater injuries. For example, if the back-up camera on a vehicle is affected by the malfunction reported by the system 200, then the back-up camera system may completely shut down in order to force the user to utilize traditional mirrors and driving techniques to operate the vehicle in reverse, without harming property or pedestrians.

If the determination in the decision block 505 results in a determination that "fail operational" mode should be started, the process 500 proceeds along the YES branch to the block 510. At the block 510, the mobile computing device (or vehicle) may warn the user about the malfunction. As another illustrative example, a vehicle may be in a semi-autonomous driving mode with the user still sitting in the driver seat (and instructed to be aware of surroundings. If one of the memory modules connected to a camera subsystem generates an ECC error via the system 200, the "fail operation" mode may alert the user via audible or haptic warnings such that the user is required to hold the steering wheel and operate the accelerometer and brakes. The user may be further instructed to pull over and wait for assistance. The process 500 then proceeds to the decision block 520.

At the decision block 520, the process 500 determines whether the mobile computing device (or vehicle) may continue operating in "fail operational" mode. Returning to the example above with respect to semi-autonomous driving, the user may simply be instructed that the semi-autonomous driving system is in a malfunction state, and the user should proceed to drive the vehicle to the destination, in spite of the malfunction. Once at the destination, the user may then be instructed to visit a qualified technician to address the issue. As such, some "fail operational" errors may be more or less severe than others. If the process 500 determines the mobile computing device (or vehicle) may continue to operate in "fail operational" mode, then the process 500 proceeds along the YES branch to the block 510.

Returning to the decision block 520, if a determination is made that "fail operational" mode is insufficient to meet user or vehicle safety standards, then the process proceeds along the NO branch to the block 515. For completeness, the decision block 505 may have already made the determination via the process 500 to enter the "safe" mode and avoid entering the "fail operational" mode described herein. In either case, at the block 515, the mobile computing device (or vehicle) may operate in "safe" mode. In general, the "safe" mode for vehicle implementations may result in the partial or complete shut down of systems (or subsystems). For example, if the malfunction transmitted by the system 200 indicates the vehicles power source can no longer operate (e.g., the electrical monitoring circuitry in the electric-powered engine are wholly unreliable), the vehicle may need to go directly to a "safe" mode where the entire vehicle is powered down and stopped completely. The process 500 then proceeds to the decision block 520.

At the decision block 525, a determination is made as to whether the mobile computing device (or vehicle) may continue operating in "safe" mode. An alternative example of "safe" mode operation may be related to back-up cameras. If the vehicle cannot operate the back-up camera due to a malfunction of the ECC function, then the vehicle may simply continue operating in "safe" mode until the vehicle is taken to a technician for repair; in the meantime, the user may rely on traditional instruments to operate the vehicle in a reverse direction (e.g., mirrors, audible alerts from pedestrians, the sound of breaking glass, etc.). If the system (or subsystem) may continue operating in "safe" mode (as demonstrated by the alternative example above), the process 500 proceeds along the YES branch to the block 515.

Returning to the decision block 525, the process 500 may determine that "safe" mode is no longer a viable option for the mobile computing device (or vehicle) because, for example, the safety of the user and bystanders may be jeopardized by continued operation. If the process 500 determines the mobile computing device (or vehicle) may no longer operate in "safe" mode, the process 500 proceeds to the reference block D, which continues on FIG. 3 described above.

Turning back to FIG. 3, briefly, the reference block D begins in the middle of the process 300, substantially above the decision block 355 (FIG. 3) where the process 300 determines whether the mobile computing device (or vehicle) should shut down. A catastrophic failure, such as voluminous ECC failures from the system 200, may inform the process 300 to shut down the vehicle by proceeding along the YES branch to the END block 390 (FIG. 3) at which point the process 300 terminates.

Figure 6:
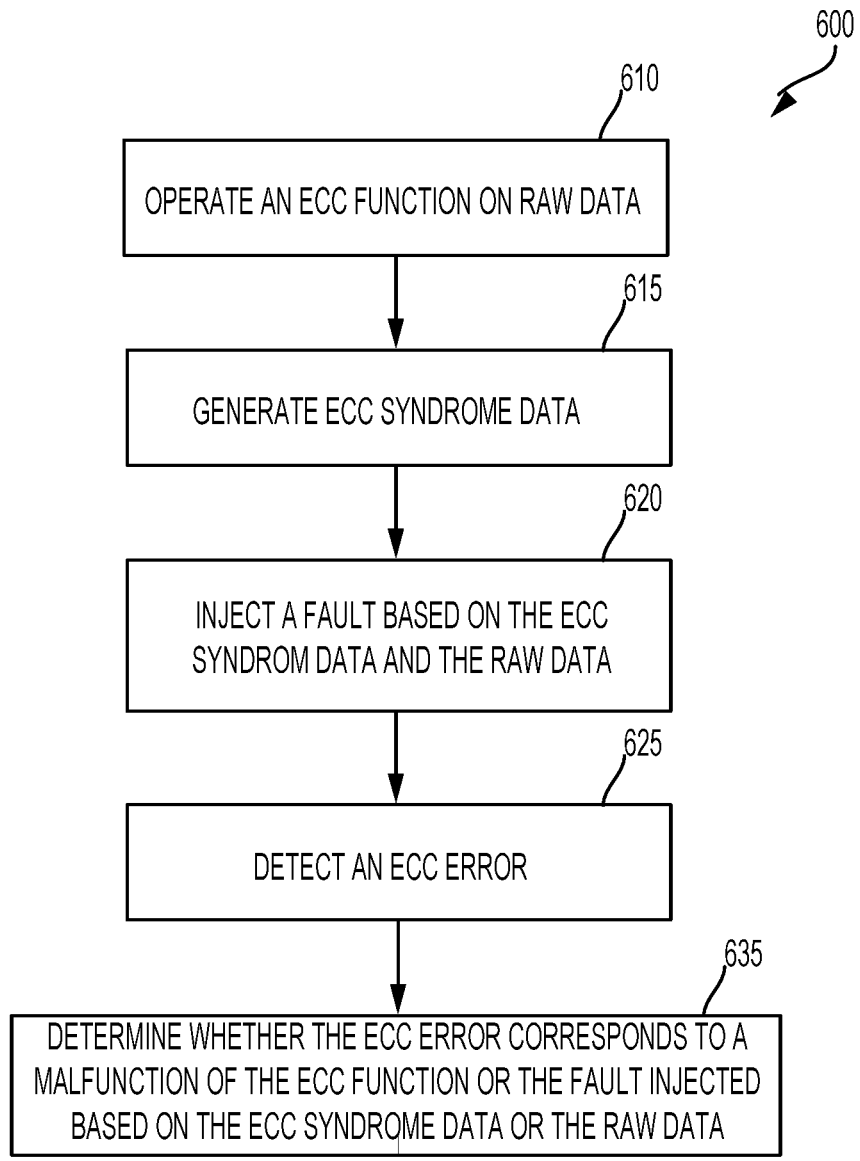
FIG. 6 is a flowchart illustrating another process in accordance with certain aspects of the disclosure.

FIG. 6 is a flowchart illustrating another process 600 in accordance with certain aspects of the disclosure. The process 300 (FIG. 3), the process 400 (FIG. 4), and the process 500 (FIG. 5) may be examples of implementations of the process 600. The blocks of the process 600 may be implemented by the system 100 or the system 200, as presented with FIGS. 1, 2A, and 2B. At the block 610, an ECC function is operated on raw data. For example, referring to FIG. 2A, the first error detection or correction path 202 operates to detect an actual ECC error within the raw data 227. The ECC generator 215 may generate ECC syndrome data 229 from the raw data 227. The data array 225 may store the raw data and the ECC syndrome data 229. The ECC checker 230 may operate an ECC algorithm known in the art to detect an actual ECC error within the raw data stored in the data array 225.

At the block 615, the ECC syndrome data is generated. For example, as part of the ECC function of the block 610, The ECC generator 215 (FIG. 2A) may generate ECC syndrome data 229 from the raw data 227. At block 620, a fault may be injected based on the ECC syndrome data and the raw data. For example, referring to FIG. 2B, the ECC diagnosis register 222 may store at least a portion of the ECC syndrome data 229 (FIG. 2A) and the raw data 227 (FIG. 2A) stored in the ECC diagnosis register 222. The ECC diagnosis mask module 224 may output a mask stream. The mask stream, when combined with the ECC syndrome data 229 (FIG. 2A) and the raw data 227 (FIG. 2A) stored in the data array 225 (FIG. 2A) by the XOR toggle 285, may inject a fault and introduce an expected ECC error as signaling on the bus 262. In such fashion, an expected ECC error is introduced or generated based on the ECC syndrome data 229 (FIG. 2A) and the raw data 227 (FIG. 2A) stored in the ECC diagnosis register 222. At block 625, an ECC error is detected. For example, referring to FIG. 2A, the ECC checker 230 may selectively operate to detect ECC error based on the ECC syndrome data 229 (FIG. 2A) and the raw data 227 stored in the data array 225 as part of the first error detection or correction path 202. Further, the ECC checker 230 may detect ECC error from the second error detection or correction path 203 via the bus 262. The detected ECC error may correspond to a malfunction of the ECC function or the fault injected based on the ECC syndrome data or the raw data (e.g., the detected ECC error being the expected ECC error).

At block 635, whether the ECC error corresponds to a malfunction of the ECC function or the fault injected based on the ECC syndrome data or the raw data is determined. For example, referring to FIG. 2A, the ECC diagnostic module 220 may receive the detected ECC error from the ECC error handler 240 via the bus 267. Referring to FIG. 2B, the test checker module 226 of the ECC diagnostic module 220 may determine whether the detected ECC error received via the bus 267 matches the expected ECC error. In a case that the detected ECC error received via the bus 267 does not match the expected ECC error, the test checker module 226 may output the interrupt 297 to, for example, the interrupt handler 250 (FIG. 2A). In one example, referring to FIG. 2A, the interrupt handler 250 may determine that the same raw data 227 and the ECC syndrome data 229 stored in the data array 225 and the ECC diagnosis register 222 did not trigger ECC error detection and/or interrupts as part of the ECC function. For example, a malfunction may occur in the memory of the ECC function (e.g., in the data array 225 of the first error detection or correction path 202). The malfunction in the memory of the ECC function may cause the first error detection or correction path 202 operating the ECC function on the raw data to not detect an ECC error. The second error detection or correction path 203, being not in the path of the malfunction, may recognize that the ECC error detected by the ECC checker 230 does not match an expected ECC error and output the interrupt 297 to the interrupt handler 250. The interrupt handler 250 may recognize and determine that the ECC function on the same raw data 227 did cause the ECC checker 230 to detect the ECC error as part of the ECC function on the same raw data 227 (e.g., no interrupt is received on the bus 265). In such fashion, the system 200 may determining whether the ECC error detected by the ECC checker 230 corresponds to the expected ECC error (generated by the ECC diagnostic module 220) or a malfunction of the ECC function (e.g., a malfunction the first error detection or correction path 202, as presented above).

Figure 7:
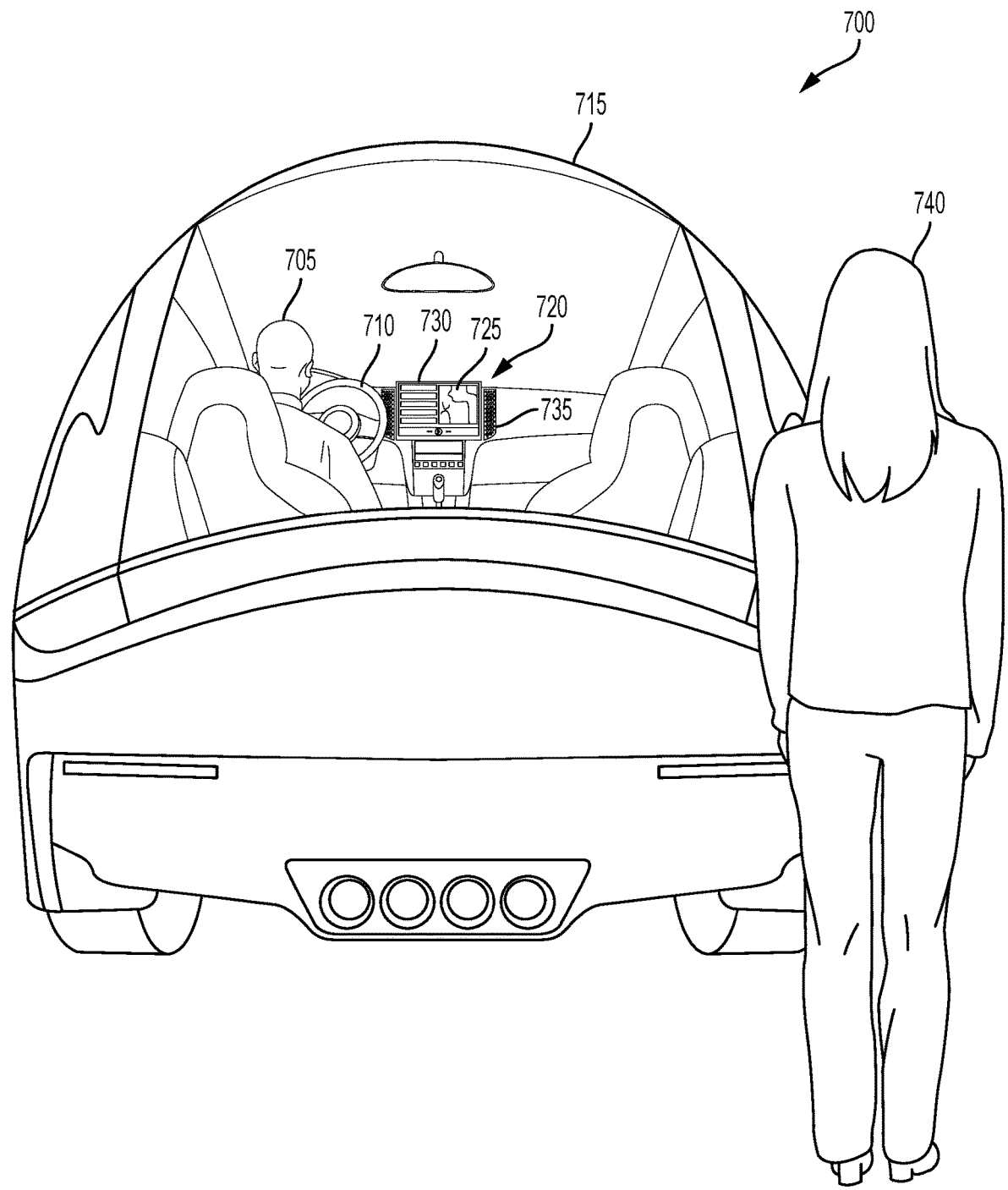
FIG. 7 illustrates a block diagram of an operating vehicle, which contains ADAS and is configured to perform an online malfunction detection of the ECC function.

FIG. 7 illustrates a block diagram of a system 700, which contains an ADAS-enabled vehicle 715 that is configured to perform an online malfunction detection of the ECC function. The vehicle 715 may be operated by a user 705.

A system 720 may be disposed within the vehicle 715. In one aspect, the system 720 may be an example of the system 100 described in FIG. 1 above. In another aspect, the system 720 may an example of the system 200 described in FIG. 2A above. In yet another aspect, the system 720 may be a hybrid version of the systems 100 (see FIG. 1) or 200 (see FIG. 2A).

The system 720 may be electronically coupled to an external processor 725. In one aspect, the external processor 725 may be an example of the external processor 140 described in FIG. 1 above. The external processor 725 depicted may be comprised of several systems (and subsystems), many of which are configured to operate ADAS within the vehicle 715. Therefore, the system 720 may be one of many modules within the vehicle 715 that are configured to check for ECC errors using the processes 300, 400, 500 (FIGS. 3, 4, and 5 respectively) described above.

The user 705 may control the vehicle 715 using a steering wheel 710. In one aspect, the steering wheel 710 is configured to give haptic warnings to the user 705 when the system 700 encounters an ECC error. For example, the ECC diagnostic module 220 (FIG. 2A) may determine that the ECC error warrants the invocation of the process 500, described in FIG. 5 above. If the system 700 can operate in a "fail operational" mode per the block 505, then the user 705 may continue to operate the vehicle 715 such that the safety of the user 705 is ensured.

The user 705 may receive audible warnings from a speaker 735 when an ECC error is detected by the ECC diagnostic module 220. As described with respect to the process 500 in FIG. 5, the user 705 may need to take corrective action when the vehicle 715 is in a "fail operational" mode (e.g., at the block 505 in the process 500; see FIG. 5). For example, the user 705 may not have their hands on the steering wheel 710 because the vehicle 715 is driving autonomously as part of the vehicle's 715 ADAS. Therefore, the user 705 may need to hear the alert relating to the ECC error detected in any one of the processes 300, 400, 500, which are described above with respect to FIGS. 3, 4, and 5, respectively.

The vehicle 715 may also have an infotainment unit 730. The infotainment unit 730 may be disposed in the dashboard of the vehicle 715 such that the user 705 may see visual warnings relating to the safe operation of the vehicle 715. Again, an ECC error may be detected by the ECC diagnostic module 220 via the processes 300, 400, 500, described above; the infotainment unit 730 may communicate whether the vehicle 715 is configured to continue in "fail operational" mode or "safe" mode. The steering wheel 710 and the speaker 735 may not be sufficient to alert the user 705 to take corrective action relating to the safe operation of the vehicle 715 if an ECC error is detected by the ECC diagnostic module 220. As such, the infotainment unit 730 may display text, images, video, or combination thereof to inform the user 705 as to how to address the error within the ADAS.

A pedestrian 740 may be in the proximity of the vehicle 715. For example, the pedestrian 740 may be walking behind the vehicle 715. In normal operating conditions, the infotainment unit 730 may be configured to display a back-up camera perspective to the user 705 when the vehicle 715 is operating in reverse. Such a back-up camera (and its associated systems) may have logic configured to detect the presence and movement of the pedestrian 740. In the event of an ECC error and/or malfunction of the ECC function, the process 500 may determine that the ECC error and/or malfunction should cause the system 720 to operate in "safe" mode (e.g., at the block 515 described in FIG. 5). Further, the "safe" mode may cause the infotainment unit 730 to display a warning to the user 705 indicating that the back-up camera is not working properly and the user 705 should rely on mirrors and other visual aids to ensure the safety of the pedestrian 740.

ADAS-enabled vehicles, such as the vehicle 715, may need to comply with certain safety standards. Such standards may include ISO 26262, entitled "Road vehicles—Functional safety." The ISO 26262 contains many requirements relating to the safe operation of an ADAS-enabled vehicle. The system 720 and/or the external processor 725 may support ISO 26262 and be configured accordingly.

Figure 8:
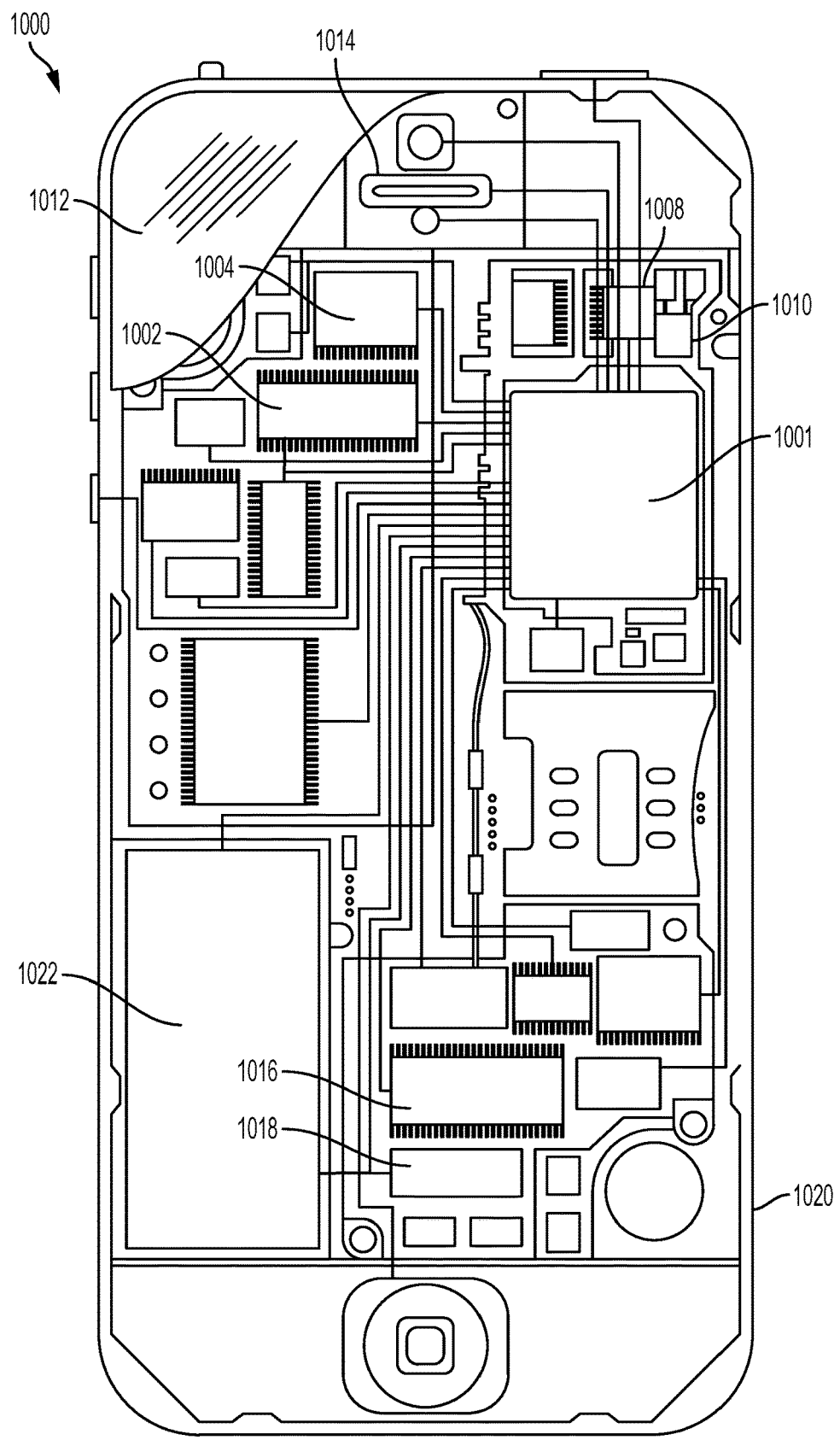
FIG. 8 is a block diagram of an aspect of a mobile computing device for incorporating the systems and the methods described herein.

The various aspects (including, but not limited to, aspects discussed above with reference to FIGS. 1 through 6) may be implemented in any of a variety of the computing devices including a mobile device 1000, an example of which is illustrated in FIG. 8. The definition of a "mobile device" is expansive as more and more electronic devices are enabled with wireless technology. Therefore, the mobile device 1000 may be an example of the systems 100, 200, 700 described above. Further the mobile device 1000 may implement the processes 300, 400, 500 as described in FIGS. 3, 4, and 5, respectively. For example, the mobile device 1000 may include a processor 1001 coupled to a touch screen controller 1004 and an internal memory 1002. The processor 1001 may be one or more multicore integrated circuits (ICs) designated for general or specific processing tasks. In one aspect, the processor 1001 may be substantially the same as SoC 102 described above. The internal memory 1002 may be volatile or non-volatile memory, and may also be secure and/or encrypted memory, or unsecure and/or unencrypted memory, or any combination thereof. The touch screen controller 1004 and the processor 1001 may also be coupled to a touch screen panel 1012, such as a resistive-sensing touch screen, capacitive-sensing touch screen, infrared sensing touch screen, etc.

The mobile device 1000 may have one or more radio signal transceivers 1008 (e.g., Peanut®, Bluetooth®, Zigbee®, Wi-Fi, RF, cellular, etc.) and antennae 1010, for sending and receiving, coupled to each other and/or to the processor 1001. The transceivers 1008 and antennae 1010 may be used with the above-mentioned circuitry to implement various wireless transmission protocol stacks and interfaces and to establish the various wireless links discussed herein. The mobile device 1000 may include one or more cellular network wireless modem chips 1016, such as one cellular network wireless modem chip, two cellular network wireless modem chips, three cellular network wireless modem chips, four cellular network wireless modem chips, or more than four cellular network wireless modem chips, that enables communication via one or more cellular networks and that are coupled to the processor 1001. The one or more cellular network wireless modem chips 1016 may enable the mobile device 1000 to receive services from one or more cellular networks (e.g., CDMA, TDMA, GSM, 3G, 4G, 5G, LTE, or any other type of cellular network), to implement various wireless transmission protocol stacks and interfaces, and to establish the various wireless links discussed herein.

The mobile device 1000 may include a peripheral device connection interface 1018 coupled to the processor 1001. The peripheral device connection interface 1018 may be singularly configured to accept one type of connection, or multiply configured to accept various types of physical and communication connections, common or proprietary, such as USB, FireWire, Thunderbolt, Ethernet, or PCIe. The peripheral device connection interface 1018 may also be coupled to a similarly configured peripheral device connection port (not shown). The mobile device 1000 may also include speakers 1014 for providing audio outputs.

The mobile device 1000 may also include a housing 1020, constructed of a plastic, metal, or a combination of materials, for containing all or some of the components discussed herein. The mobile device 1000 may include a power source 1022 coupled to the processor 1001, such as a disposable or rechargeable battery. The rechargeable battery may also be coupled to the peripheral device connection port to receive a charging current from a source external to the mobile device 1000.

Additionally, one of ordinary skill in programming is able to write computer code or identify appropriate hardware and/or circuits to implement the disclosed invention without difficulty based on the flow charts and associated description in this specification, for example.

Therefore, disclosure of a particular set of program code instructions or detailed hardware devices is not considered necessary for an adequate understanding of how to make and use the invention. The inventive functionality of the claimed computer implemented processes is explained in more detail in the above description and in conjunction with the Figures which may illustrate various process flows.

In one or more exemplary aspects, the functions described may be implemented in hardware, software, firmware, or any combination thereof. If implemented in software, the functions may be stored on or transmitted as one or more instructions or code on a computer-readable medium. Computer-readable media include both computer storage media and communication media including any medium that facilitates transfer of a computer program from one place to another. A storage media may be any available media that may be accessed by a computer. By way of example, and not limitation, such computer-readable media may comprise RAM, ROM, EEPROM, NAND flash, NOR flash, M-RAM, P-RAM, R-RAM, CD-ROM or other optical disk storage, magnetic disk storage or other magnetic storage devices, or any other medium that may be used to carry or store desired program code in the form of instructions or data structures and that may be accessed by a computer.

Also, any connection is properly termed a computer-readable medium. For example, if the software is transmitted from a website, server, or other remote source using a coaxial cable, fiber optic cable, twisted pair, digital subscriber line ("DSL"), or wireless technologies such as infrared, radio, and microwave, then the coaxial cable, fiber optic cable, twisted pair, DSL, or wireless technologies such as infrared, radio, and microwave are included in the definition of medium.

Disk and disc, as used herein, includes compact disc ("CD"), laser disc, optical disc, digital versatile disc ("DVD"), floppy disk and Blu-ray disc where disks usually reproduce data magnetically, while discs reproduce data optically with lasers. Combinations of the above should also be included within the scope of computer-readable media.

Alternative aspects will become apparent to one of ordinary skill in the art to which the invention pertains without departing from its spirit and scope. Therefore, although selected aspects have been illustrated and described in detail, it will be understood that various substitutions and alterations may be made therein without departing from the spirit and scope of the present invention, as defined by the following claims.

What is claimed is:

1. A method for error-correction code ("ECC") error handling, the method comprising:
   operating an ECC function on raw data, the ECC function comprises:
      generating ECC syndrome data by an ECC syndrome data generating module, the ECC syndrome data being derived from the raw data;
      injecting a fault based on the ECC syndrome data or the raw data;
      detecting an ECC error by an ECC checker;
      determining whether the ECC error detected by the ECC checker corresponds to a malfunction of the ECC function or the fault injected based on the ECC syndrome data or the raw data;
   delaying the detecting the ECC error by the ECC checker until the raw data is not being accessed, the raw data being received based on a quality of service parameter; and
      adjusting the quality of service parameter to reduce the delaying the detecting the ECC error by the ECC checker, in response to the delaying the detecting the ECC error being in excess of a fault-tolerant deadline.

2. The method of claim 1, further comprising
   storing the raw data or the ECC syndrome data in a memory;
   storing the raw data or the ECC syndrome data in a second memory, the fault injected being based on the raw data or the ECC syndrome data stored in the second memory.

3. The method of claim 1, wherein the malfunction of the ECC function comprises a malfunction in a memory storing the raw data or the ECC syndrome data or in the ECC syndrome data generating module of the ECC function.

4. The method of claim 1, wherein the ECC function further comprises
   detecting, by the ECC checker, an actual ECC error in the raw data using the ECC syndrome data.

5. The method of claim 1, further comprising:
   notifying a user, by one of a mobile computing device or a vehicle, a system malfunction in response to the determining the ECC error detected by the ECC checker corresponds to the malfunction of the ECC function.

6. A system for error-correction code ("ECC") error handling, the system comprising:
   a memory, the memory configured to store raw data and ECC syndrome data;
   at least one processor coupled to the memory and configured to:
   operate an ECC function on the raw data, the ECC function comprises:
      generating ECC syndrome data, the ECC syndrome data being derived from the raw data;
      injecting a fault based on the ECC syndrome data and the raw data;
      detect an ECC error;
      determine whether the ECC error corresponds to a malfunction of the ECC function or the fault injected based on the ECC syndrome data and the raw data, wherein the at least one processor is further configured to
   delay detecting the ECC error until the raw data is not being accessed, the raw data being received based on a quality of service parameter and to
   adjust the quality of service parameter to reduce the delay, in response to the delay being in excess of a fault-tolerant deadline.

7. The system of claim 6, further comprising:
   a second memory configured to store the raw data and the ECC syndrome data, wherein the at least one processor is further configured to inject the fault based on the raw data and the ECC syndrome data stored in the second memory.

8. The system of claim 6, wherein the malfunction of the ECC function comprises a malfunction in the memory storing the raw data or the ECC syndrome data or in an ECC syndrome data generating module of the ECC function.

9. The system of claim 6, wherein the ECC function further comprises
   detecting an actual ECC error in the raw data using the ECC syndrome data.

10. The system of claim 6, further comprising one of a mobile computing device and a vehicle incorporating the memory and the at least one processor, wherein the one of the mobile computing device and the vehicle is further configured to notify a user of a system malfunction in response to the at least one processor determining the ECC error corresponds to the malfunction of the ECC function.

11. A system for error-correction code ("ECC") error handling, the system comprising:
   an error detection or correction path configured to perform an ECC function on raw data, wherein the error detection or correction path comprises
   an ECC syndrome data generating module configured to generate ECC syndrome data from the raw data;
   a test checker module, comprising hardware, configured to inject a fault based on the ECC syndrome data and the raw data;
   an ECC checker configured to detect an ECC error, wherein the test checker module is further configured to determine whether the ECC error detected by the ECC checker corresponds a malfunction of the ECC function or the fault injected based on the ECC syndrome data and the raw data,
   wherein the test checker module is further configured to delay detection of the ECC error by the ECC checker until the raw data is not being accessed, the raw data being received based on a quality of service parameter, and to
   adjust the quality of service parameter to reduce the delay of the detection of the ECC error by the ECC checker, in response to the delay of the detection of the ECC error by the ECC checker being in excess of a fault-tolerant deadline.

12. The system of claim 11, further comprising:
   a memory configured to store the raw data or the ECC syndrome data; and
   a second memory configured to store the raw data or the ECC syndrome data, wherein the test checker module is further configured to inject the fault based on the raw data or the ECC syndrome data stored in the second memory.

13. The system of claim 11, wherein the fault in the ECC function comprises a malfunction in a memory configured to store the raw data or the ECC syndrome data, or in the ECC syndrome data generating module of the ECC function.

14. The system of claim 11, wherein the error detection or correction path further comprises the ECC checker, the ECC checker being further configured to detect an actual ECC error in the raw data using the ECC syndrome data.

15. The system of claim 11, further comprising:
one of a mobile computing device and a vehicle configured to notify a user of a system malfunction in response to the test checker module determining the ECC error detected by the ECC checker corresponds to the malfunction of the ECC function.

16. A system, comprising:
a first error detection or correction path, comprising hardware, the first error detection or correction path being configured to perform an ECC function on raw data; and
a second error detection or correction path, comprising hardware, configured to receive the raw data to determine an ECC error being resulted from a malfunction in the first error detection or correction path from the raw data, while the first error detection or correction path is online, the first error detection or correction path and the second error detection or correction path operating in parallel.

17. The system of claim 16, wherein the first error detection or correction path comprises a memory configured to store the raw data or ECC syndrome data derived from the raw data,
wherein the malfunction in the first error detection or correction path comprising a malfunction in the memory.

18. The system of claim 17, wherein the memory functions as a cache.

19. The system of claim 17, wherein the second error detection or correction path comprises a second memory configured to store the raw data or the ECC syndrome data.

20. The system of claim 19, wherein the second error detection or correction path comprises a module configured to inject a fault based on the raw data or the ECC syndrome data stored in the second memory.

21. The system of claim 16, further comprising one of a mobile computing device and a vehicle incorporating the first error detection or correct path and the second error detection or correction path.

22. The system of claim 21, wherein the one of the mobile computing device and the vehicle is configured to notify a user of a system malfunction in response to the second error detection or correction path determining the ECC error being resulted from the malfunction in the first error detection or correction path.

* * * * *